(12) United States Patent
Takado

(10) Patent No.: US 12,563,315 B2
(45) Date of Patent: Feb. 24, 2026

(54) IMAGING DEVICE, IMAGING SYSTEM, MOVING BODY, AND INSTRUMENT

(71) Applicant: CANON KABUSHIKI KAISHA, Tokyo (JP)

(72) Inventor: Hisashi Takado, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 191 days.

(21) Appl. No.: 18/369,342

(22) Filed: Sep. 18, 2023

(65) Prior Publication Data

US 2024/0098381 A1      Mar. 21, 2024

(30) Foreign Application Priority Data

Sep. 21, 2022      (JP) ................................ 2022-150477

(51) Int. Cl.
| | |
|---|---|
| *H04N 25/68* | (2023.01) |
| *H04N 25/633* | (2023.01) |
| *H04N 25/671* | (2023.01) |
| *H04N 25/77* | (2023.01) |
| *H04N 25/773* | (2023.01) |
| *H10F 30/225* | (2025.01) |
| *H10F 39/00* | (2025.01) |

(52) U.S. Cl.
CPC ............. *H04N 25/68* (2023.01); *H04N 25/77* (2023.01); *H10F 39/809* (2025.01)

(58) Field of Classification Search
CPC ........ H04N 25/68; H04N 25/77; H04N 25/62; H04N 25/671; H04N 25/633; H04N 25/773; H04N 9/7817; H04N 13/125; H10F 39/809; H10F 39/8057; H10F 30/225
See application file for complete search history.

(56) References Cited

U.S. PATENT DOCUMENTS

| | | | | |
|---|---|---|---|---|
| 8,619,163 | B2 * | 12/2013 | Ogura | H04N 15/134 |
| | | | | 348/242 |
| 9,900,532 | B2 | 2/2018 | Takado et al. | |
| 9,900,535 | B2 | 2/2018 | Takado | |
| 9,912,886 | B2 | 3/2018 | Shigeta et al. | |
| 10,044,992 | B2 | 8/2018 | Takado | |
| 10,122,951 | B2 | 11/2018 | Takado et al. | |
| 10,244,192 | B2 | 3/2019 | Shigeta et al. | |
| | | (Continued) | | |

OTHER PUBLICATIONS

Byoung-Soo Choi et al., "CMOS image sensor using pixel aperture technique for single-chip 2D and 3D imaging" 217 IEEE Sensor Conference, Glasgow, UK, pp. 13 (Year: 2017).*

*Primary Examiner* — Marly S Camargo
(74) *Attorney, Agent, or Firm* — Venable LLP

(57) ABSTRACT

An imaging device includes a photoelectric device in which a plurality of pixels containing a photoelectric element including an avalanche photodiode are arranged in a two-dimensional array, and a processor that processes output signals of the plurality of pixels. The plurality of pixels includes a first pixel unit having imaging pixels, and a second pixel unit having at least one set of pixels including an aperture pixel and light shielded pixels that surround at least a part of the aperture pixel, and the processor uses output signals of the aperture pixel and the light shielded pixels of the set of the pixels to generate a correction pattern for correcting output signals of the imaging pixels, the correction pattern corresponding to an output pattern of the set of the aperture pixel and the light shielded pixels.

19 Claims, 17 Drawing Sheets

(56) References Cited

U.S. PATENT DOCUMENTS

| 10,477,165 | B2 | 11/2019 | Takado |
| 10,645,325 | B2 | 5/2020 | Takado et al. |
| 10,979,647 | B2 | 4/2021 | Takado |
| 11,057,582 | B2 | 7/2021 | Takado |
| 11,159,759 | B2 | 10/2021 | Takado et al. |
| 11,284,023 | B2 | 3/2022 | Yamanaka et al. |
| 11,297,273 | B2 | 4/2022 | Sekine et al. |
| 11,418,733 | B2 | 8/2022 | Takado |
| 2007/0030365 | A1 | 2/2007 | Jerdev |
| 2011/0069210 | A1* | 3/2011 | Ogua ..................... H04N 23/84 |
| | | | 348/247 |
| 2018/0270405 | A1* | 9/2018 | Ota .......................... H10F 39/12 |
| 2019/0132536 | A1* | 5/2019 | Watanabe ........... H10F 19/8057 |
| 2023/0362507 | A1* | 11/2023 | Murata ................. H10F 39/182 |
| 2024/0107192 | A1* | 3/2024 | Numata ............... H04N 25/671 |

\* cited by examiner

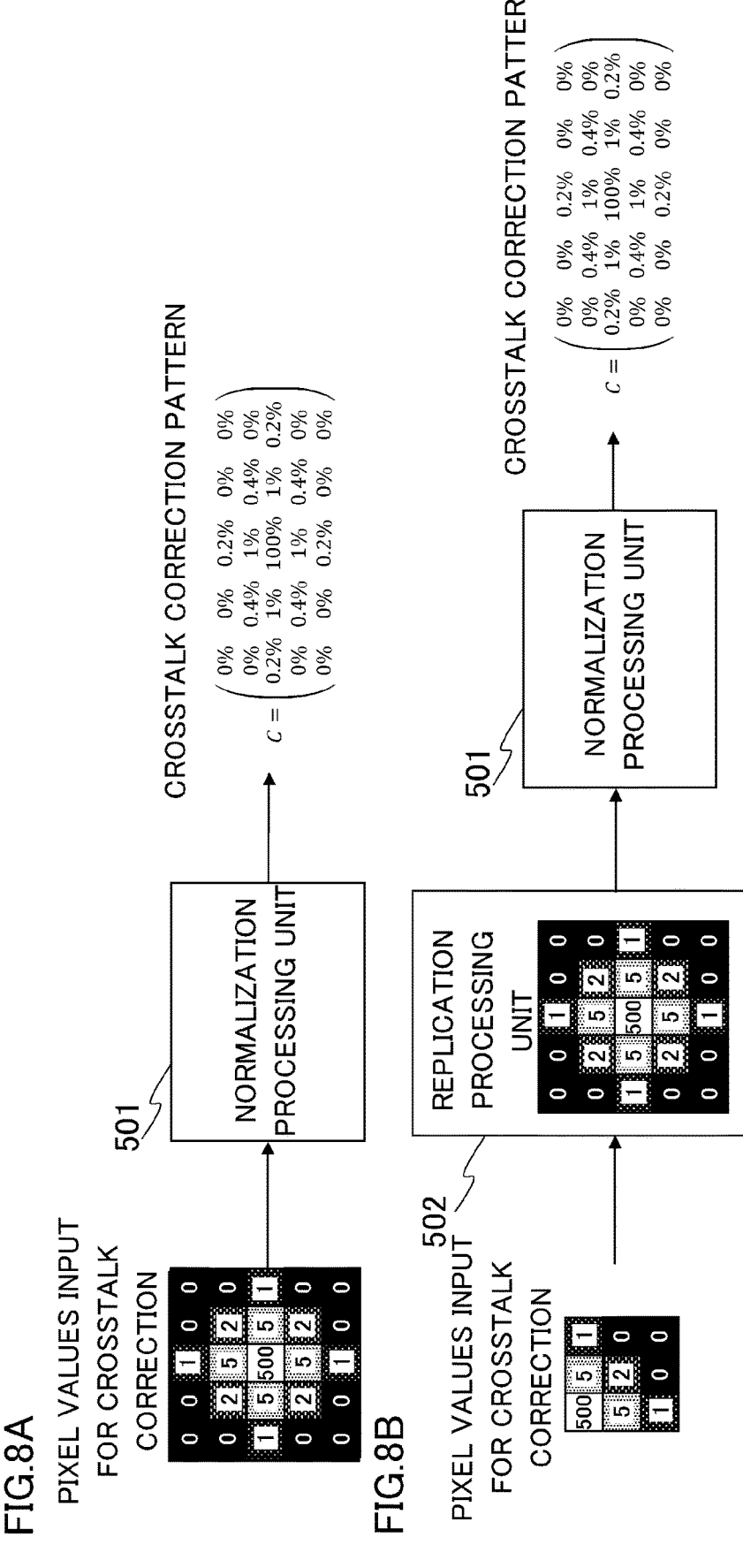

OUTPUT FROM APERTURE
PIXELS BEFORE CORRECTION

OUTPUT AFTER
CROSSTALK CORRECTION

DECONVOLUTION APPLIED TO
CROSSTALK CORRECTION PATTERN $$C = \begin{pmatrix} 0\% & 0\% & 0.2\% & 0\% & 0\% \\ 0\% & 0.4\% & 1\% & 0.4\% & 0\% \\ 0.2\% & 1\% & 100\% & 1\% & 0.2\% \\ 0\% & 0.4\% & 1\% & 0.4\% & 0\% \\ 0\% & 0\% & 0.2\% & 0\% & 0\% \end{pmatrix}$$

IMAGING DEVICE, IMAGING SYSTEM, MOVING BODY, AND INSTRUMENT

BACKGROUND OF THE INVENTION

Field of the Invention

The present disclosure relates to an imaging device, an imaging system, a moving body, and an instrument.

Description of the Related Art

There have been proposed means of correcting output signals from faulty pixels (defective pixels) in imaging devices.

For example, one known method locates a pixel outputting a higher level of signal than the surrounding pixels and identifies it as defective, and substitutes the output signal of the defective pixel with an average of the output signals of the surrounding pixels (U.S. Patent Application Publication No. 2007/0030365).

However, merely substituting the output value of the defective pixel with an output signal of other pixels as in the correction method described in U.S. Patent Application Publication No. 2007/0030365 may result in low-accuracy correction and lead to degradation of the quality of resultant images.

SUMMARY OF THE INVENTION

The present disclosure was made in view of the above, with an aim to minimize deterioration of image quality through improvement of the correction accuracy of output signals from pixels.

According to some embodiments, an imaging device includes a photoelectric device in which a plurality of pixels containing a photoelectric element including an avalanche photodiode are arranged in a two-dimensional array, and a processor that processes output signals of the plurality of pixels, wherein the plurality of pixels includes a first pixel unit having imaging pixels, and a second pixel unit having at least one set of pixels including an aperture pixel and light shielded pixels that surround at least a part of the aperture pixel, and the processor uses output signals of the aperture pixel and the light shielded pixels of the set of the pixels to generate a correction pattern for correcting output signals of the imaging pixels, the correction pattern corresponding to an output pattern of the set of the aperture pixel and the light shielded pixels.

According to some embodiments, an imaging system includes the imaging device as described above, and a signal processor that processes signals output from the imaging device.

According to some embodiments, a moving body includes the imaging device as described above, a moving device, a signal processor that acquires information from signals output from the imaging device, and a controller that controls the moving device based on the information.

According to some embodiments, an instrument includes the imaging device as described above, wherein the instrument further includes at least any one of: an optical device operable with the imaging device, a controller that controls the imaging device, a signal processor that processes signals output from the imaging device, a display device that displays information acquired by the imaging device, a memory device that stores information acquired by the imaging device, and a machine that operates based on information acquired by the imaging device.

Further features of the present invention will become apparent from the following description of exemplary embodiments with reference to the attached drawings.

BRIEF DESCRIPTION OF THE DRAWINGS

FIG. 1 is a schematic illustration of a photoelectric device according to one embodiment;

FIG. 2 is a schematic illustration of a substrate of the photoelectric device according to one embodiment;

FIG. 3 is a schematic illustration of a circuit substrate of the photoelectric device according to one embodiment;

FIGS. 8A and 8B are block diagrams of a correction pattern generation process in the imaging device according to the first embodiment;

DESCRIPTION OF THE EMBODIMENTS

Figure 4:
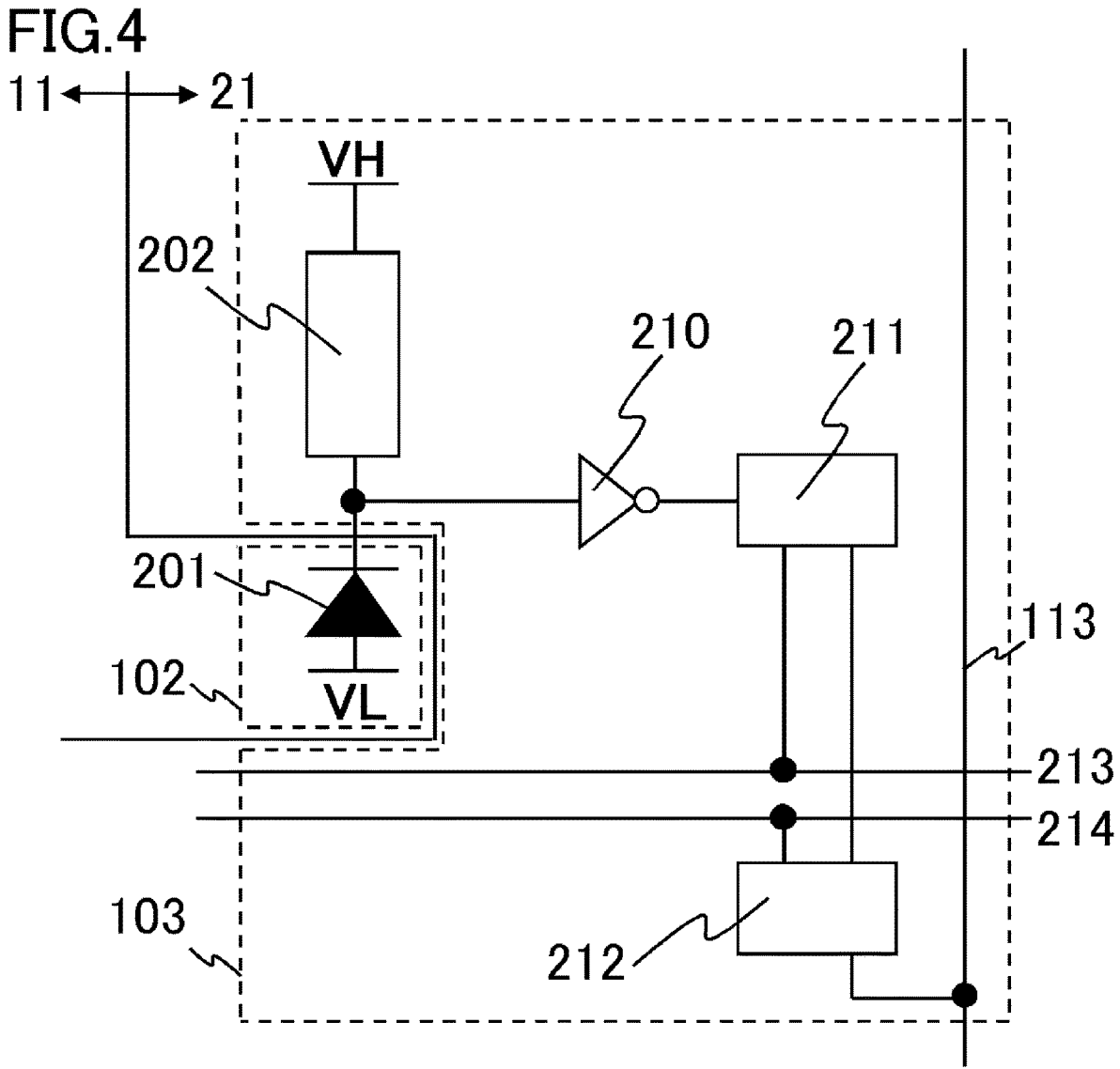
FIG. 4 illustrates a configuration example of a pixel circuit of the photoelectric device according to one embodiment.

Embodiments of the present disclosure are described below with reference to the drawings. The present disclosure is not limited to the following embodiments. Changes can be made as required without departing from the scope of the subject matter of the disclosure. The elements in the drawings to be described below that have the same functions are given the same reference numerals and these elements may not be described again or described in a simpler manner.

The following embodiments will mainly describe photoelectric devices in a solid-state image sensor (imaging device) as one application example. It should be noted that these embodiments are not limited to the application in solid-state image sensors (imaging devices) but applicable also to usage in other devices, which include, for example, range finders (distance measuring instruments that use focus detection or ToF (Time of Flight)), photometers (instruments that measure the amount of incident light), and so on.

First Embodiment

The embodiments of the present invention are now described in detail below with reference to the drawings. In the following description, terms that indicate specific directions or positions (such as "upper," "lower," "right," "left," and other words or phrases including these terms) will be used as required. It should be noted that these terms are used merely for facilitating the understanding of the embodiments with reference to the drawings and should not be interpreted to limit the technical scope of the present invention.

The term "plan view" as used herein refers to a view from a direction perpendicular to the light incident surface of a semiconductor layer. A "cross section" refers to a plane perpendicular to the light incident surface of the semiconductor layer. In the case where the light incident surface of the semiconductor layer is microscopically a rough surface, the "plan view" is defined based on a macroscopic view of the light incident surface of the semiconductor layer.

The imaging device of this embodiment reads out signals from the cathode of APDs (avalanche photodiodes), with the anode being fixed to a constant potential. Namely, a semiconductor region of a first doping type, where the charges of the same polarity as the signal charges are the majority carriers, refers to an N-type semiconductor region, while a semiconductor region of a second doping type, where the charges of the opposite polarity to the signal charges are the majority carriers, refers to a P-type semiconductor region. It should be noted that the embodiments are applicable also to the case where signals are read out from the anode of APDs while the cathode is fixed to a constant potential. In this case, the semiconductor region of a first doping type, where the charges of the same polarity as the signal charges are the majority carriers, will be the P-type semiconductor region, while the semiconductor region of a second doping type, where the charges of the opposite polarity to the signal charges are the majority carriers, will be the N-type semiconductor region. While one case will be described below where one node of the APDs is fixed to a constant potential, the potential may be made variable at both nodes.

The term "impurity concentration" simply used herein refers to a net concentration of impurities calculated by subtracting the amount of impurities compensated for by the impurities of the opposite doping type. Namely, "impurity concentration" means net doping concentration. A P-type semiconductor region is a region where the doping concentration of P-type impurities is higher than the doping concentration of N-type impurities. Conversely, an N-type semiconductor region is a region where the doping concentration of N-type impurities is higher than the doping concentration of P-type impurities.

Figure 1:
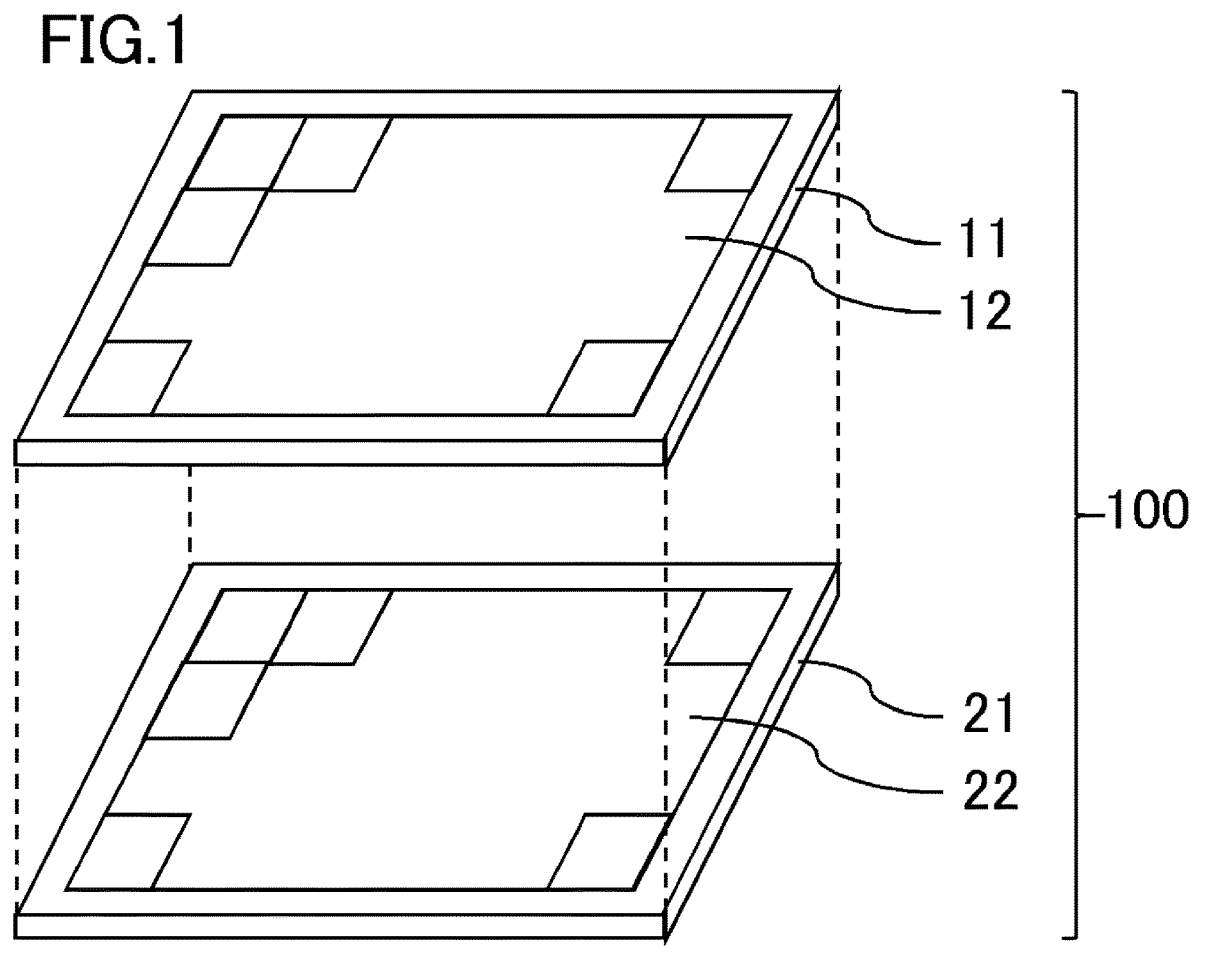

A photoelectric device and a method of driving this device according to the present invention will be hereinafter described with reference to FIG. 1 to FIGS. 5A and 5B.

FIG. 1 is a diagram illustrating a configuration of a stacked photoelectric device 100 according to this embodiment. The photoelectric device 100 has two substrates, a sensor substrate 11 and a circuit substrate 21, which are stacked upon one another and electrically connected. The sensor substrate 11 has a first semiconductor layer including photoelectric elements 102 to be described later, and a first wiring structure. The circuit substrate 21 has a second semiconductor layer including circuits such as signal processors 103 to be described later, and a second wiring structure. The photoelectric device 100 is composed of the second semiconductor layer, second wiring structure, first wiring structure, and first semiconductor layer stacked in this order from bottom to top. The photoelectric device described in the following embodiments is a backside illumination type, in which light enters from a first surface and a circuit substrate is arranged on a second surface.

In the following, the sensor substrate 11 and circuit substrate 21 are described as diced chips, but the substrates are not limited to chips. For examples, both substrates may be wafers. The substrates may be in the form of wafers and stacked first and diced after that, or, wafers may be diced first and the chips may be stacked and joined together after that.

A pixel region 12 is positioned on the sensor substrate 11, and a circuit region 22 is located on the circuit substrate 21, where the signals detected in the pixel region 12 are processed.

Figure 2:
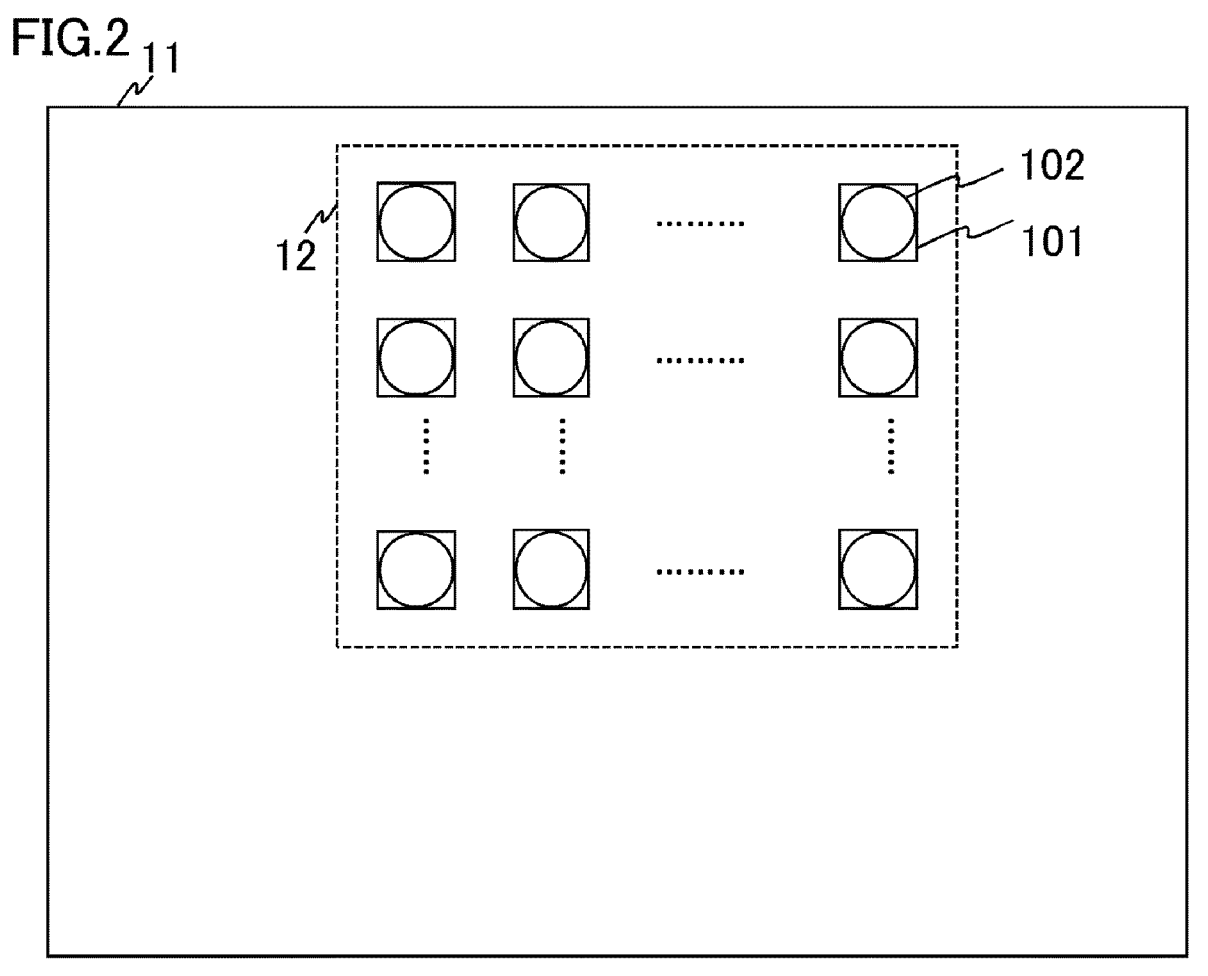

FIG. 2 is a diagram illustrating a layout example of the sensor substrate 11. In the plan view of the sensor substrate 11, pixels 101 that each contain a photoelectric element 102 including an APD are arranged in a two-dimensional array, thereby forming the pixel region 12.

The pixels 101 are typically imaging pixels, but not necessarily so in applications where ToF (Time of Flight) is used. Namely, the pixels 101 may measure the time the light has taken to travel and the amount of light.

Figure 3:
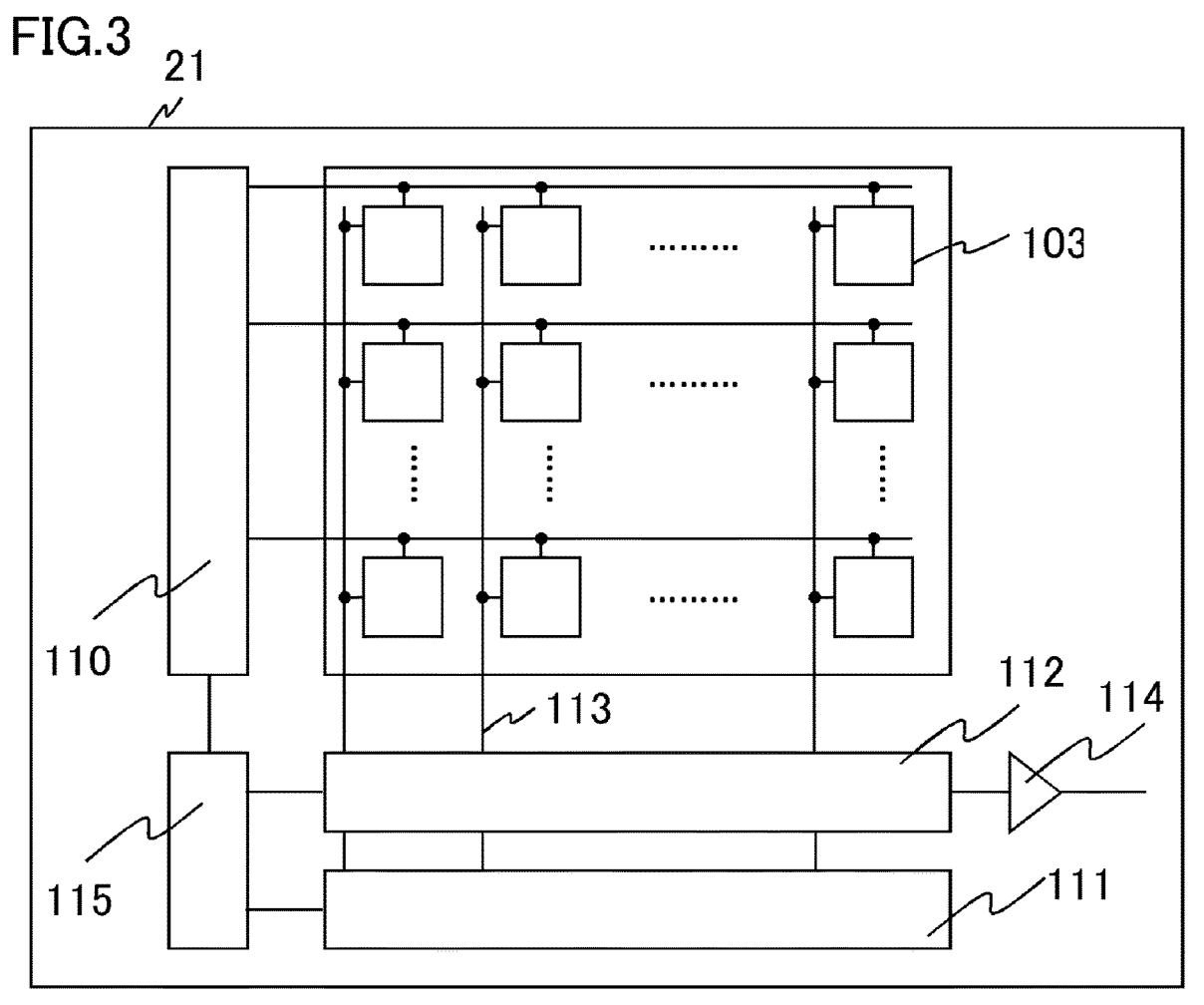

FIG. 3 is a configuration diagram of the circuit substrate 21. The circuit substrate 21 includes signal processors 103 that process electric charge signals obtained by photoelectric conversion from the photoelectric elements 102 in FIG. 2, a column circuit 112, a control pulse generator 115, a horizontal scanning circuit unit 111, a signal line 113, and a vertical scanning circuit unit 110. The photoelectric elements 102 in FIG. 2 and the signal processors 103 in FIG. 3 are electrically connected via connection wiring provided to each of the pixels.

The vertical scanning circuit unit 110 receives a control pulse supplied from the control pulse generator 115, and provides the control pulse to each pixel. A logic circuit such as a shift register or address decoder is used for the vertical scanning circuit unit 110.

The signals output from the photoelectric elements 102 of the pixels are processed by the signal processors 103. The signal processors 103 include counters and memories that retain digital values.

The horizontal scanning circuit unit 111 inputs a control pulse to the signal processors 103 to sequentially select one column after another and to read out digital signals kept in the respective memories of the pixels.

The signal processor 103 of a pixel selected by the vertical scanning circuit unit 110 outputs a signal associated with the selected column to the signal line 113. The signal output to the signal line 113 is output to a recording unit or signal processor outside the photoelectric device 100 via an output circuit 114.

The photoelectric elements in the pixel region in FIG. 2 may be aligned in a one-dimensional arrangement. Not all the photoelectric elements need necessarily have the functions of the signal processor. For example, one signal processor may be shared by a plurality of photoelectric elements and the signal processing can be performed sequentially.

As shown in FIG. 2 and FIG. 3, a plurality of signal processors 103 are arranged in a region overlapping the pixel region 12 in plan view. The vertical scanning circuit unit 110, horizontal scanning circuit unit 111, column circuit 112, output circuit 114, and control pulse generator 115 are arranged such as to overlap an area between an edge of the sensor substrate 11 and an edge of the pixel region 12 in plan view. In other words, the sensor substrate 11 includes the pixel region 12 and a non-pixel region arranged around the pixel region 12, and the vertical scanning circuit unit 110, horizontal scanning circuit unit 111, column circuit 112, output circuit 114, and control pulse generator 115 are arranged in the area overlapping the non-pixel region in plan view.

FIG. 4 is one example of a block diagram including equivalent circuits of FIG. 2 and FIG. 3. In FIG. 2, the photoelectric elements 102 including APDs 201 are provided on the sensor substrate 11, and other components are provided on the circuit substrate 21.

The APD 201 is a photoelectric converter that generates charge carrier pairs in response to incident light by the photoelectric effect. A voltage VL (first voltage) is supplied to the anode of the APD 201. A voltage VH (second voltage) higher than the voltage VL to the anode is supplied to the cathode of the APD 201. A reverse bias voltage is supplied across the anode and cathode to induce avalanche multiplication in the APD 201. The application of voltage in this manner brings about avalanche multiplication of charges generated by incident light, resulting in the generation of an avalanche current.

There are two operation modes depending on the manner of reverse voltage biasing: In Geiger mode, the APD is operated with a potential difference across the anode and cathode being above the breakdown voltage, and in linear mode, the APD is operated with a potential difference across the anode and cathode near or below the breakdown voltage.

Here, APDs operating in Geiger mode are referred to as SPADs (Single Photon Avalanche Diodes). The voltage VL (first voltage) is −30V, and the voltage VH (second voltage) is 1V, for example. The APDs 201 may be operated in linear mode, or may be operated in Geiger mode. SPADs, which operate with a larger potential difference than APDs operating in linear mode, are designed to withstand high bias voltages, and therefore an SPAD is preferably used as the APD 201.

A quenching element 202 is connected between a power supply that supplies the voltage VH and the APD 201. The quenching element 202 functions as a load circuit (quench circuit) at the time of signal multiplication caused by avalanche multiplication, i.e., it serves the function of controlling the voltage supplied to the APD 201 to stop excessive avalanche multiplication (quenching). The quenching element 202 also serves to restore the voltage level of the APD 201 that was dropped by the quenching back to VH by applying a current (recharging).

The signal processor 103 includes a waveform shaping unit 210, a counter circuit 211, and a selection circuit 212. The signal processor 103 described herein may only need to include one of the waveform shaping unit 210, counter circuit 211, and selection circuit 212.

The waveform shaping unit 210 takes the signal that represents potential changes occurring at the cathode of APD 201 when a photon is detected, and shapes it to generate a pulse signal as the output. An inverter circuit is used for the waveform shaping unit 210, for example. While FIG. 4 illustrates one example in which one inverter is used as the waveform shaping unit 210, a circuit of multiple series-connected inverters may be used, or other circuits that offer waveform shaping may also be used.

The counter circuit 211 counts the pulse signal output from the waveform shaping unit 210, and retains the count values. When a control pulse pRES is supplied via a drive line 213, the signal retained in the counter circuit 211 is reset.

The control pulse pSEL is supplied to the selection circuit 212 from the vertical scanning circuit unit 110 in FIG. 3 via the drive line 214 in FIG. 4 (not shown in FIG. 3) to electrically connect and disconnect the counter circuit 211 and the signal line 113. The selection circuit 212 includes a buffer circuit, for example, for outputting a signal.

Optionally, a switch such as a transistor may be disposed between the quenching element 202 and the APD 201, or between the photoelectric element 102 and the signal processor 103 to enable switching between electrical connection and disconnection. Similarly, a switch such as a transistor may be used to electrically switch between supply and interruption of the voltage VH or VL to the photoelectric element 102.

The configuration shown in this embodiment uses a counter circuit 211. Instead of the counter circuit 211, the photoelectric device 100 may use a TDC (Time to Digital Converter) and a memory to acquire the pulse detection timing. In this case, the generation timing of the pulse signal output from the waveform shaping unit 210 is converted into a digital signal by the TDC. A control pulse pREF (reference signal) is supplied to the TDC from the vertical scanning circuit unit 110 in FIG. 3 via a drive line for the measurement of the timing of the pulse signal. Based on the control pulse pREF, the TDC acquires a digital signal by processing the signal representing relative time intervals between inputs of the signals from the pixels that are output via the waveform shaping unit 210.

Figure 5B:
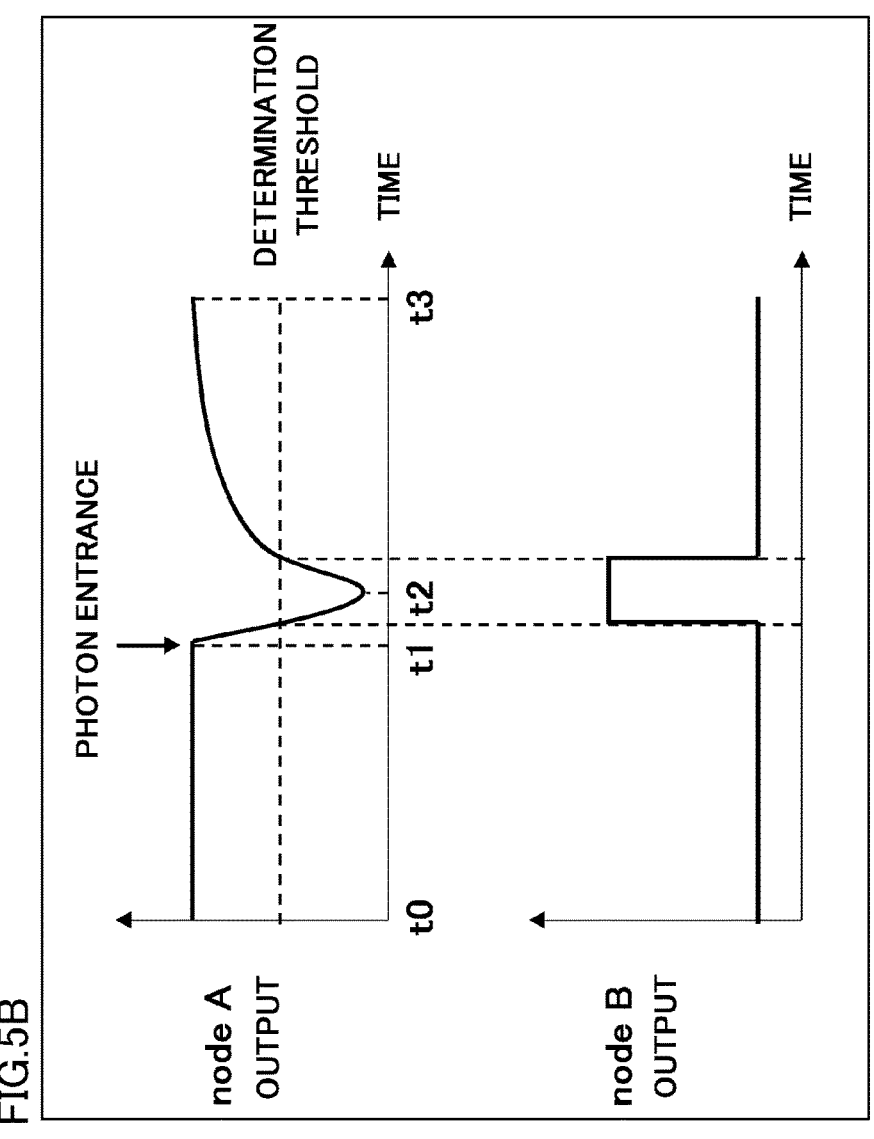
FIGS. 5A and 5B are diagrammatic views illustrating how the pixel circuit of the photoelectric device according to one embodiment is driven.
Figure 5A:
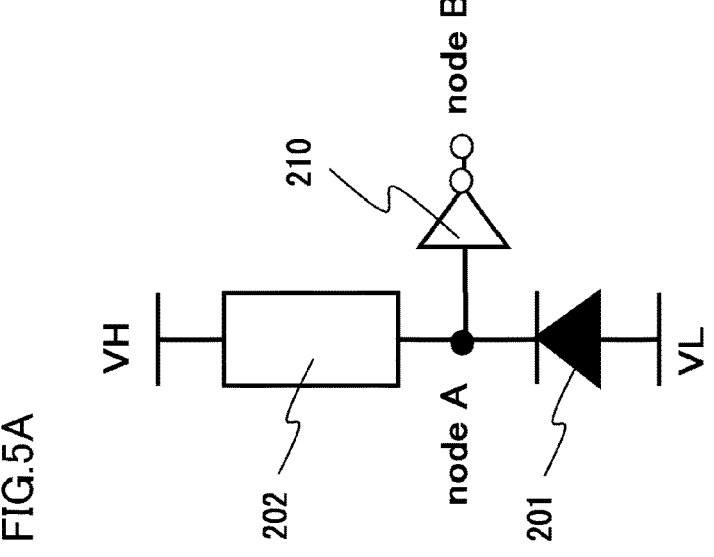

FIG. 5A and FIG. 5B are diagrammatic views illustrating the relationship between the operation of the APD and output signals in this embodiment. FIG. 5A shows a part of the circuit in FIG. 4 including the APD 201, quenching element 202, and waveform shaping unit 210. The input side and output side of the waveform shaping unit 210 are denoted respectively as node A and node B. The upper graph in FIG. 5B shows the waveform of the signal from the node A in FIG. 5A, and the lower graph shows the waveform of the signal from the node B in FIG. 5A.

A potential difference VH−VL is applied to the APD 201 in FIG. 5A between time t0 to time t1. Entrance of a photon to the APD 201 at time t1 induces avalanche multiplication in the APD 201, which causes an avalanche multiplication current to flow in the quenching element 202 so that the voltage at node A drops. As the voltage drops further and the potential difference applied to the APD 201 reduces, the avalanche multiplication stops in the APD 201 at time t2 so that the voltage level of node A stops falling below a certain level. A current flows to node A from voltage VL to compensate for the voltage drop between time t2 and time t3 so that the potential level of node A is restored at time t3. The waveform shaping unit 210 conditions the waveform output from node A by clipping the portions exceeding a certain threshold and outputs the shaped waveform as a signal from node B.

The layout of the signal lines 113 and the arrangement of the column circuit 112 and output circuit 114 are not limited to those shown in FIG. 3. For example, the signal lines 113 may extend along the rows, and the column circuit 112 may be arranged at the distal end of the signal lines 113.

An imaging device 300 according to some embodiments is described below. An imaging device according to a first embodiment is described with reference to FIG. 6 to FIG. 9.

Figure 6:
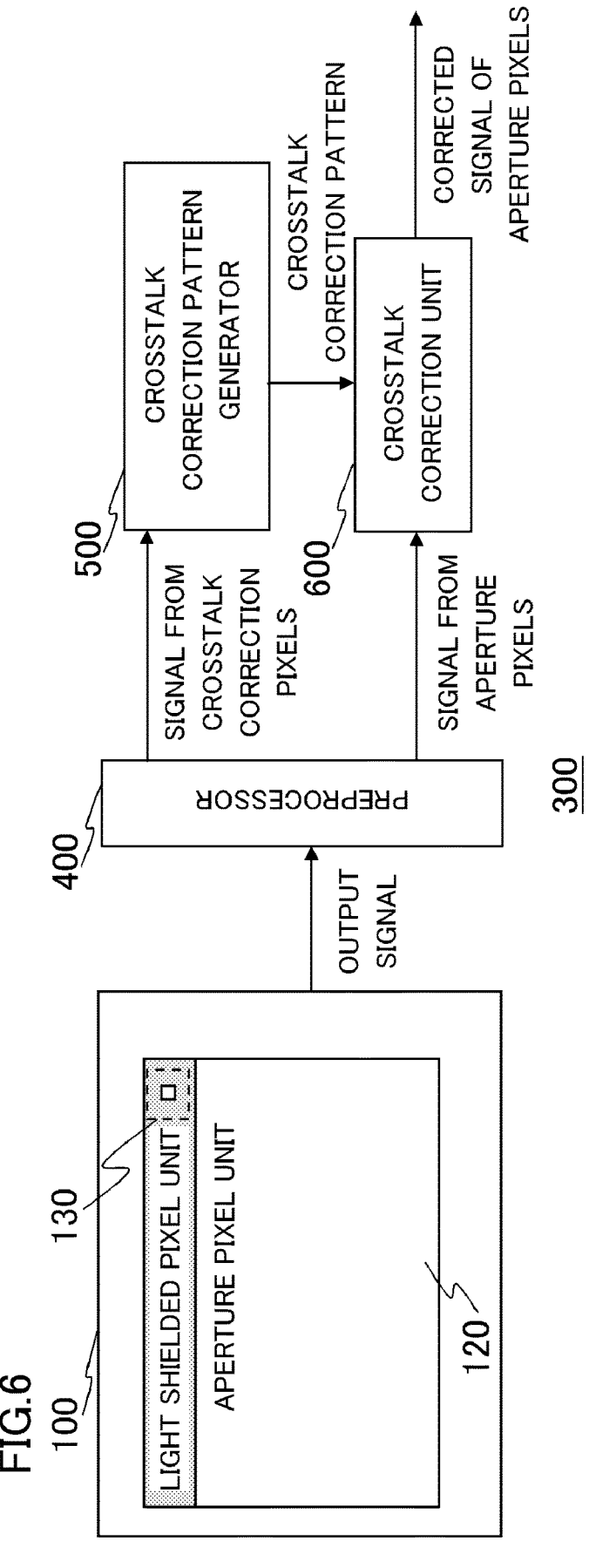
FIG. 6 is a block diagram of an imaging device according to a first embodiment.

FIG. 6 is a block diagram illustrating the entire imaging device 300. The imaging device 300 includes the photoelectric device 100 described above, a preprocessor 400, a crosstalk correction pattern generator 500, and a crosstalk correction unit 600.

The photoelectric device 100 includes a plurality of pixels arranged in a two-dimensional array. More specifically, the photoelectric device 100 includes an aperture pixel unit 120 where pixels that output image signals are arranged in an array; a light shielded pixel unit configured with light shielded pixels with a light-shielding film on their light incident surface to block out light; and a crosstalk correction pixel unit 130 that is an area where an aperture pixel is surrounded by light shielded pixels. The aperture pixel unit 120 corresponds to "a first pixel unit containing imaging pixels." The crosstalk correction pixel unit 130 corresponds to "a second pixel unit having at least one set of an aperture pixel and light shielded pixels that surround at least part of the aperture pixel."

The crosstalk correction pixel unit 130, which is a characteristic feature of the imaging device 300 of this embodiment, is configured with light shielded pixels surrounding an aperture pixel. Namely, the crosstalk correction pixel unit 130 includes at least one set of an aperture pixel and light shielded pixels that surround at least part of the aperture pixel. This is because of the following reason. In the case where the pixels are avalanche photodiodes (APDs), for example, crosstalk can occur as a result of light emission from avalanche breakdown during the recombination of carriers that were generated in the avalanche multiplication process. The crosstalk resulting from the light emission due to avalanche breakdown in the aperture pixel affects the outputs of the surrounding light shielded pixels. Therefore, the configuration in which light shielded pixels are provided around an aperture pixel can help calculate the impact of crosstalk on the output signals.

The preprocessor 400 performs preprocessing prior to the signal processing. The output signals from the photoelectric device 100 are input to the preprocessor 400. The preprocessing involves offset correction, gain correction, etc., of various signals performed as required. The preprocessor 400 separately outputs the signals from the pixels provided for crosstalk correction, and the signals from the aperture pixels for imaging, to the downstream signal processors (crosstalk correction pattern generator 500 and crosstalk correction unit 600).

The crosstalk correction pattern generator 500 uses the signals from the pixels provided for crosstalk correction to generate a crosstalk correction pattern that represents the impact of avalanche multiplication in one aperture pixel on the surrounding pixels in the form of a crosstalk probability matrix. This crosstalk correction pattern is a correction pattern that corresponds to the pattern of outputs from the aperture pixel and light shielded pixels that form one set of pixels in the crosstalk correction pixel unit 130.

The crosstalk correction unit 600 corrects the signals from the aperture pixels for imaging that are input from the preprocessor 400 using the crosstalk correction pattern that is output from the crosstalk correction pattern generator 500, and outputs the corrected signals as the signals of the effective imaging pixels.

Figure 7A:
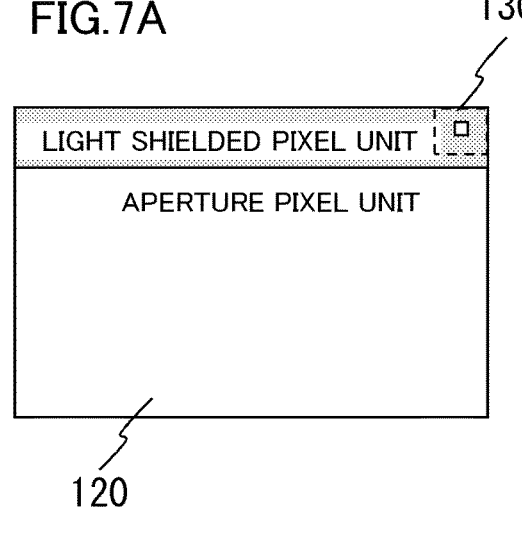
FIGS. 7A and 7B illustrate a pixel arrangement in the imaging device according to the first embodiment.
Figure 7B:
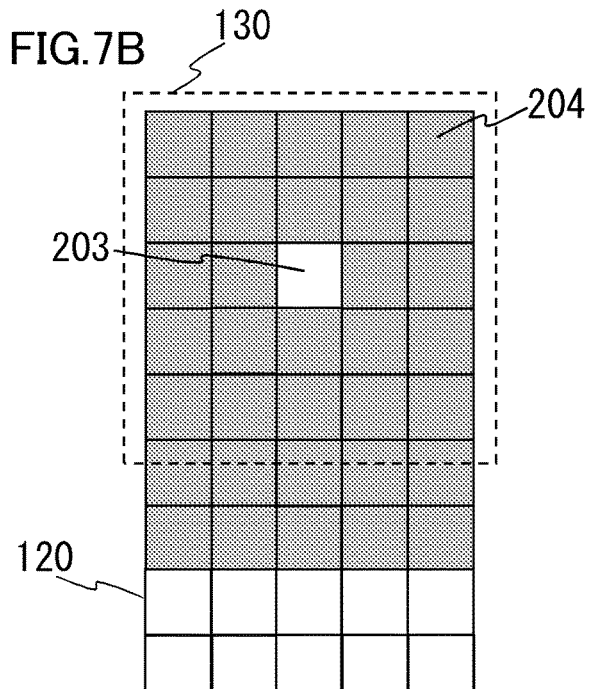

The embodiments of the present invention will be described in more detail with reference to FIG. 7A and FIG. 7B. FIG. 7A and FIG. 7B are diagrams illustrating the pixel arrangement of the photoelectric device 100. FIG. 7B is a partial enlarged view illustrating a part of the crosstalk correction pixel unit 130 of FIG. 7A. In the photoelectric device 100 of this embodiment, the pixels are arranged in a 5×5 array in the crosstalk correction pixel unit 130. The pixel at the center is an aperture pixel. In the aperture pixel, avalanche multiplication occurs as light enters, which leads to light emission due to avalanche breakdown. In the light shielded pixels, the light-induced avalanche multiplication does not occur, and therefore, the output from the light shielded pixels will reflect the influence of crosstalk caused by the light emission due to avalanche breakdown in the aperture pixel. While the pixels are arranged in a 5×5 array in the crosstalk correction pixel unit 130 in this embodiment, the pixel arrangement is not limited to this. The pixels may be arranged in a 7×7 or 3×3 array, for example, depending on to which extent the impact of crosstalk should be corrected.

In the photoelectric device 100, it is preferable to separate or distance the crosstalk correction pixel unit 130 away from the aperture pixel unit 120 for imaging to minimize the impact of crosstalk from the aperture pixel unit 120 for imaging. In this embodiment, as shown in FIG. 7B, there are two light shielded pixels between the aperture pixel unit 120 for imaging and the crosstalk correction pixel unit 130. It is preferable to separate the crosstalk correction pixel unit 130 from the aperture pixel unit 120 by at least the same number of light shielded pixels as the number of rows or columns of light shielded pixels surrounding the aperture pixel in the crosstalk correction pixel unit. There need not necessarily be provided a pixel structure between the aperture pixel unit for imaging and the crosstalk correction pixel unit, as long as they are separated from each other by a distance that covers the region affected by crosstalk from the aperture pixel unit 120 for imaging.

FIG. 8A and FIG. 8B are block diagrams illustrating one example of a correction pattern generation process executed by the crosstalk correction pattern generator 500. In this embodiment, as shown in FIG. 8A, outputs from the 5×5 pixels that form the crosstalk correction pixel unit 130 are input to a normalization processing unit 501. The normalization processing unit 501 generates a crosstalk correction pattern through normalization of signals input from the pixels for crosstalk correction based on a ratio between the output signal (value 500 in the drawing) of the aperture pixel and the output signals of the light shielded pixels (other values than 500 in the drawing). The crosstalk correction pattern thus produced configures two-dimensional data of N rows and M columns where one of N and M represents an integer of 2 or more and the other represents an integer of 1 or more.

In the case where there is a black level offset, the normalization processing unit 501 may obtain a difference between an output signal of a light shielded pixel that is not affected by crosstalk and the signals input from the pixels dedicated to crosstalk correction. The normalization processing unit 501 may then obtain ratios between the output signals of the light shielded pixels and the output signal of the aperture pixel in the signals input from the pixels provided for crosstalk correction.

FIG. 8B illustrates a variation example of the crosstalk correction pattern generation process described above. In the example shown in FIG. 8B, the output signals from the light shielded pixels in a lower right section, i.e., the aperture pixel and the 3×3 light shielded pixels to the right of and below the aperture pixel, are used as the signals representing the pixel values for crosstalk correction. In plan view of the pixel unit, the crosstalk across the pixels occurs isotopically. Therefore, a replication process may be carried out to the output signals of the aperture pixel and some of the light shielded pixels for the generation of the crosstalk correction pattern, instead of using the output signals of all the pixels in the crosstalk correction pixel unit 130. As shown in FIG. 8B, the crosstalk correction pattern generator 500 includes a replication processing unit 502. In this variation example, it is assumed that the impact of crosstalk on the light shielded pixels in the lower right section is the same as that of the light shielded pixels in each of the upper right, upper left, and lower left sections. Accordingly, the replication processing unit 502 performs a replication process to the output signals from the light shielded pixels in the lower right section, i.e., the aperture pixel and the 3×3 light shielded pixels to the right of and below the aperture pixel, to produce output signals of 5×5 array pixels. The normalization processing unit 501 generates a crosstalk correction pattern using the output signals of the 5×5 pixels from the replication processing unit 502. In this variation example, the crosstalk correcting pattern can be generated using a replication process. As the processing of the output signals from the pixels in the upper right, upper left, and lower left sections is omitted, the efficiency of generating crosstalk correction patterns is expected to improve.

As shown in FIG. 8B, the crosstalk correction pattern generated by the replication processing unit 502 is two-dimensional array data. One row or one column of this two-dimensional array data extracted as one-dimensional data has a peak value at the center. This one-dimensional data has a distribution in which values change monotonously from the peak value at the center of the data array toward both ends. Another one-dimensional data arrayed in a direction perpendicular to the aforementioned one-dimensional data in the original two-dimensional array data underlying the one-dimensional data, which shares the peak value at the center of the previously extracted one-dimensional data, also has a distribution in which values change monotonously from the center of the data array toward data ends. The value at the center may be a bottom value instead of a peak value.

Figure 9:
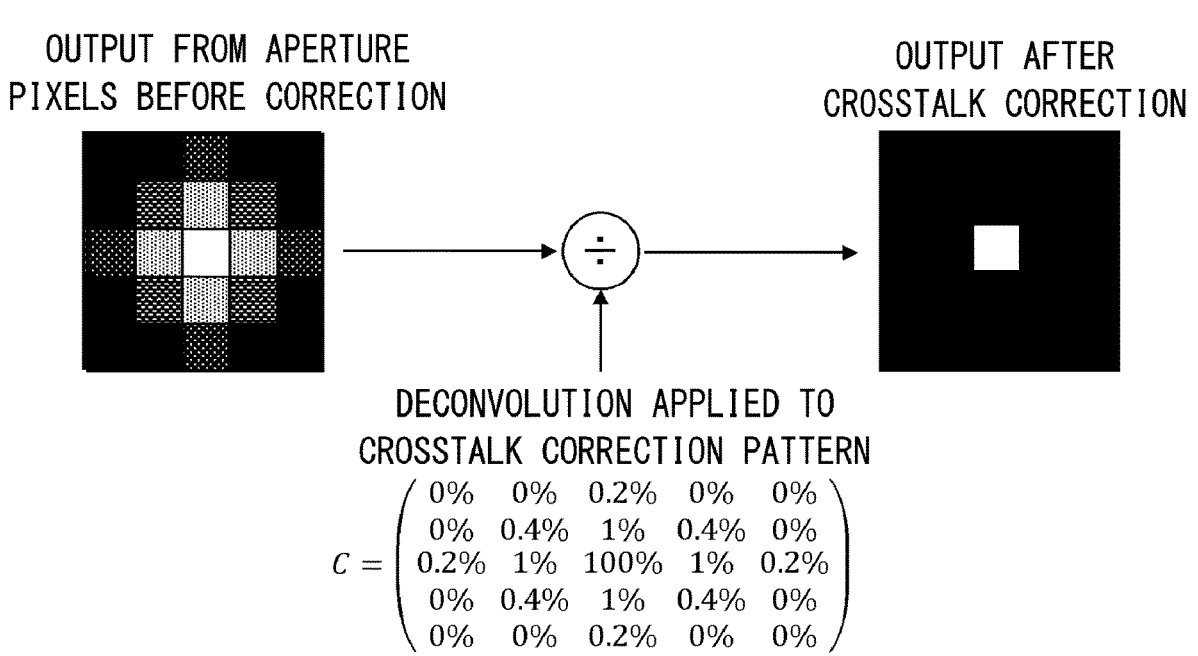
FIG. 9 is a diagrammatic view of a correction process in the imaging device according to the first embodiment.

FIG. 9 is a diagrammatic illustration of a correction process executed by the crosstalk correction unit 600. The crosstalk correction unit 600 performs division to the output signals of the effective imaging pixels prior to correction using the crosstalk correction pattern generated by the crosstalk correction pattern generator 500. Division here is a deconvolution operation, for example. As shown in FIG. 9, this correction process by the crosstalk correction unit 600 using division can produce pixel values ("output after crosstalk correction" in the drawing) corrected to mitigate or eliminate the impact of crosstalk.

The correction process in turn enables the imaging device 300 to extract only the signal component of a defective pixel excluding the impact of light-induced crosstalk, from an image in which the surrounding pixels of the defective pixel are affected by the crosstalk due to light emission from the defective pixel. This feature contributes to an improvement in the level of accuracy of defect correction performed by a defective pixel correction circuit downstream of the crosstalk correction unit 600. Moreover, in situations where a regular image exhibits decreased image quality, such as reduced resolution caused by blurred object edges due to light-induced crosstalk, the imaging device 300 can effectively enhance resolution and improve image quality by mitigating the impact of crosstalk.

Light-induced crosstalk in pixels can manifest in various ways, depending on factors such as temperature conditions, voltage conditions, individual variations, and chronological changes in the imaging device. The conventional technique of crosstalk correction, which relies on fixed correction conditions, may result in low-accuracy correction, and may leave certain pixels uncorrected. According to this embodiment, a pixel unit dedicated to crosstalk correction is provided on the same substrate as the aperture pixel unit for imaging, and a crosstalk correction pattern is generated in real time for the output signals from the aperture pixel unit. Therefore, the crosstalk correction pattern can be generated in consideration of varying factors such as temperature conditions, voltage conditions, individual variations, and chronological changes in the imaging device, which allows for enhancement of the correction accuracy.

Second Embodiment

Next, an imaging device according to a second embodiment is described with reference to FIG. 10A to FIG. 10C and FIG. 11. The following mainly describes the differences from the first embodiment. The configurations similar to those of the first embodiment are given the same reference numerals and will not be described in detail.

Figures 10A, 10B, 10C:
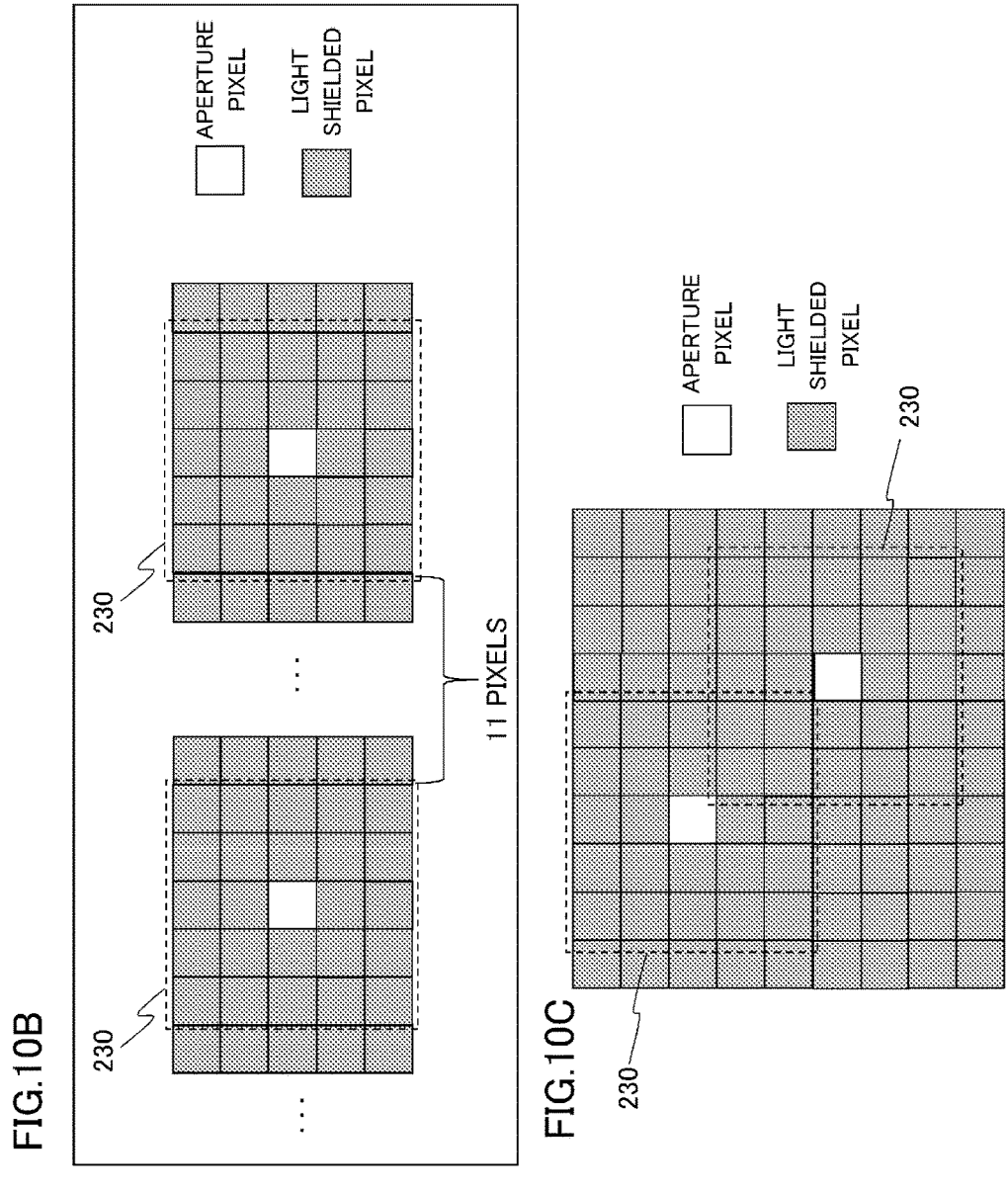
FIGS. 10A to 10C illustrate a pixel arrangement in an imaging device according to a second embodiment.

FIG. 10A is a diagram illustrating the pixel arrangement of the photoelectric device 100 according to the second embodiment. Unlike the pixel arrangement in the first embodiment, a plurality of crosstalk correction pixel units 230 are provided around the aperture pixel unit 120 for imaging in the photoelectric device 100 of this embodiment. That is, in the photoelectric device 100 of this embodiment, there are provided multiple sets of an aperture pixel and light shielded pixels around it that form the crosstalk correction pixel unit 230. Namely, there are at least two sets of an aperture pixel and light shielded pixels as the crosstalk correction pixel units 230 in this embodiment.

Depending on the conditions of imaging, there can be a situation where the aperture pixel in the crosstalk correction pixel unit saturates, or the pixel value output is near zero in the imaging device 300. If this is the case, it may not be possible to correctly generate a crosstalk correction pattern if there is only one crosstalk correction pixel unit 130 for the aperture pixel unit 120 for imaging as in the first embodiment. In this embodiment, a plurality of crosstalk correction pixel units are provided for the aperture pixel unit 120 for imaging. Therefore, the crosstalk correction pattern generator can use only the output values of the aperture pixels of crosstalk correction pixel units that are within a correct range when generating the crosstalk correction pattern. The crosstalk correction pattern can be generated based on an average of the output signals from the plurality of aperture pixels, which can help reduce the impact of noise in the corrected values.

Taking into consideration the cases where the amount of incident light in the aperture pixel unit varies within the screen depending on the imaging conditions or due to the dependence on the incident angle at screen edges, the plurality of crosstalk correction pixel units 230 should preferably be arranged around the aperture pixel unit 120 for imaging as shown in FIG. 10A.

FIG. 10B is a schematic illustration of the configuration of the crosstalk correction pixel units 230 arranged above the aperture pixel unit 120 for imaging. As shown in FIG. 10B, in each set of one aperture pixel and light shielded pixels that form one crosstalk correction pixel unit 230, the light shielded pixels are arranged in a 5×5 array around one aperture pixel. The aperture pixels of the crosstalk correction pixel units 230 are located in the same row as shown in FIG. 10B, and there are 15 pixels between the adjacent aperture pixels. This interval between the aperture pixels is set for the purpose of eliminating the impact of crosstalk between the aperture pixels of adjacent crosstalk correction pixel units 230. Namely, this embodiment uses at least two sets of an aperture pixel and light shielded pixels as the crosstalk correction pixel units 230, a first pixel set having a first aperture pixel and a second pixel set having a second aperture pixel. The first aperture pixel and the second aperture pixel are spaced apart by at least two pixels.

FIG. 10C shows a variation example of this embodiment in which the aperture pixels of adjacent crosstalk correction pixel units 230 are located in different rows so that they are in diagonal positions. The intensity of light-induced crosstalk between aperture pixels tends to be high in up and down direction and left to right direction of the aperture pixels and low in diagonal directions. By arranging the aperture pixels of adjacent crosstalk correction pixel units 230 in diagonal positions to each other, the aperture pixels can be positioned closer to one another compared to the arrangement shown in FIG. 10B. This configuration offers the advantage of minimizing the impact of crosstalk while maintaining proximity between the aperture pixels. In FIG. 10C, there is a region where the crosstalk correction pixel units 230 overlap. The output signals of the light shielded pixels in this overlapped region can be obtained by the replication process described above using the output signals of the light shielded pixels in a non-overlapped region during the crosstalk correction pattern processing that is performed later.

Figure 11:
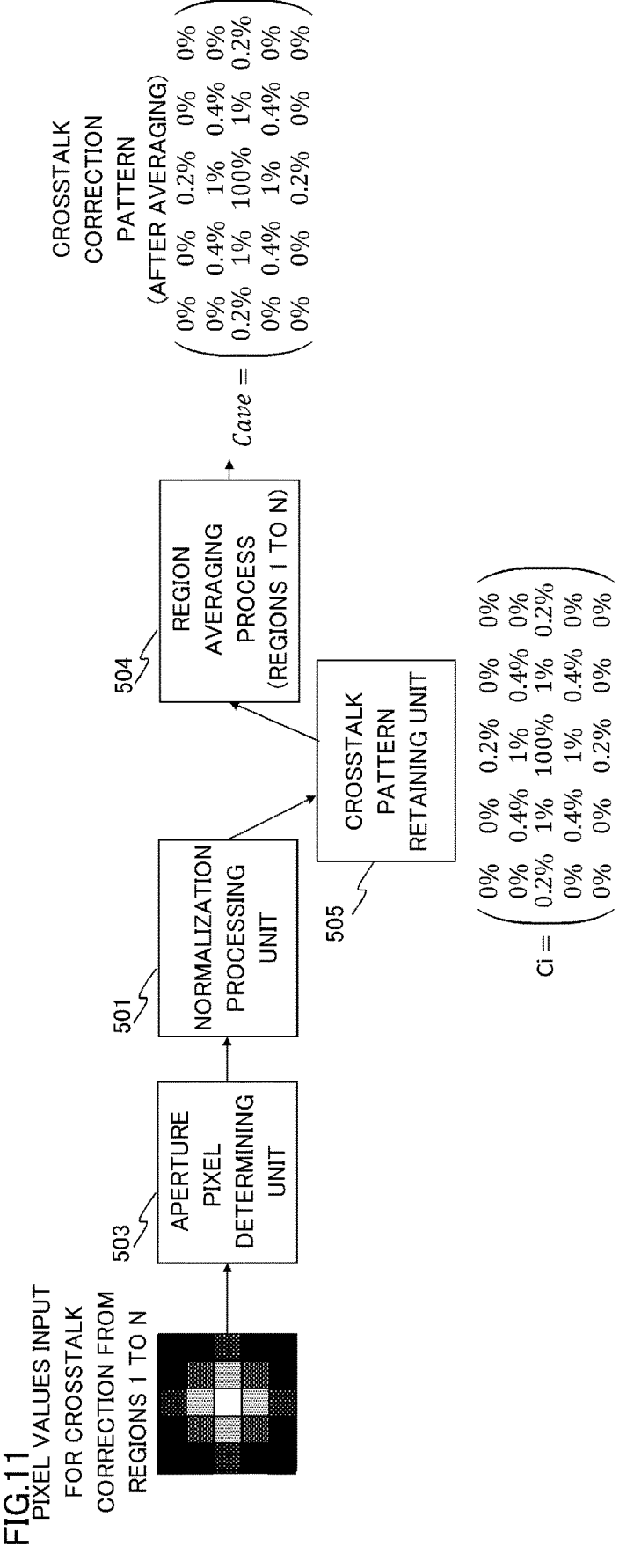
FIG. 11 is a block diagram of a correction pattern generation process in the imaging device according to the second embodiment.

FIG. 11 is a block diagram of a processor that executes the correction pattern generation process in the crosstalk correction pattern generator 500 of this embodiment. As shown in FIG. 11, the crosstalk correction pattern generator 500 generates a crosstalk correction pattern through processing performed by an aperture pixel determining unit 503, the normalization processing unit 501, a crosstalk pattern retaining unit 505, and a region averaging unit 504. In the following description, N represents the number of crosstalk correction pixel units 230 provided in the imaging device 300, and 1 to N represent the regions taken up by the respective crosstalk correction pixel units 230.

First, the aperture pixel determining unit 503 determines whether or not the output signals from the aperture pixels of the crosstalk correction pixel units 230 in regions 1 to N are within a predetermined range. This process allows the output signals from the aperture pixels that are not suitable for the generation of a crosstalk correction pattern to be sorted out, in situations where any of the aperture pixels of the crosstalk correction pixel units 230 in regions 1 to N is saturated or outputting a low value.

Next, similarly to the first embodiment, the normalization processing unit 501 obtains ratios between the output signals from the aperture pixels and the light shielded pixels. The output signals from the aperture pixels that were determined as suitable by the aperture pixel determining unit 503 are retained in the crosstalk pattern retaining unit 505. The region averaging unit 504 performs averaging to the output signals within the suitable range from the aperture pixels of the crosstalk correction pixel units 230 in regions 1 to N. This averaging process is expected to improve the accuracy of the crosstalk correction patterns generated in real time.

Third Embodiment

An imaging device according to a third embodiment is described with reference to FIG. 12A to FIG. 12C and FIG. 13. The following mainly describes the differences from the first and second embodiments. The configurations similar to those of the first and second embodiments are given the same reference numerals and will not be described in detail.

Figures 12A, 12B, 12C, 12D:
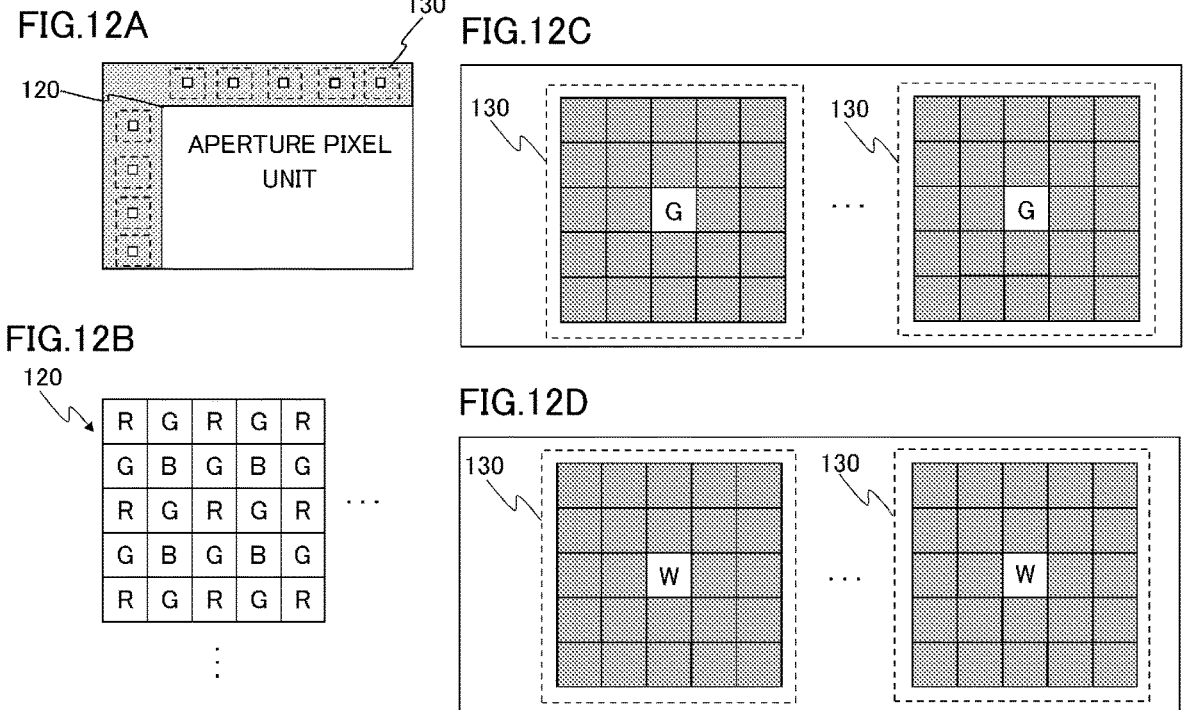
FIGS. 12A to 12D illustrate a pixel arrangement in an imaging device according to a third embodiment.

FIG. 12A is a diagram illustrating the pixel arrangement of the photoelectric device 100 according to the third embodiment. This embodiment is different from the first embodiment in that the pixels in the aperture pixel unit 120 for imaging are arranged in an RGB Bayer pattern for color imaging, and that the aperture pixels in the crosstalk correction pixel units 130 are provided with a single color filter. Therefore, the aperture pixel unit 120 for imaging in this embodiment is configured with pixels with two or more different spectral sensitivities (here, red pixels, green pixels, and blue pixels), and the aperture pixels in the crosstalk correction pixel units 130 are formed by pixels having one spectral sensitivity.

FIG. 12A illustrates one example of a pixel arrangement of the photoelectric device 100 according to this embodiment. As shown in FIG. 12A, there are regions of light shielded pixels of crosstalk correction pixel units 130 above and on the left side of the aperture pixel unit 120 for imaging in the imaging device 300 of this embodiment. A plurality of crosstalk correction pixel units 130 are provided around the aperture pixel unit 120 for imaging. Therefore, similarly to the second embodiment, the output signals from the aperture pixels of multiple crosstalk correction pixel units 130 can be averaged or selected in the process of generating a crosstalk correction pattern.

FIG. 12B illustrates the color filter arrangement for the pixels in the aperture pixel unit 120 for imaging. As shown in FIG. 12B, the pixels in the aperture pixel unit 120 for imaging are arranged in a Bayer pattern that uses a common RGB color filter. Not to mention, other patterns than the Bayer pattern may also be used, or an RGBW pixel pattern that uses white pixels in addition to the Bayer pattern may also be used.

FIG. 12C illustrates one example of a pixel arrangement in the crosstalk correction pixel unit 130. As shown in FIG. 12C, the aperture pixels of respective crosstalk correction pixel units 130 are configured with a single color filter (green). This is because the pixels dedicated for crosstalk correction need only output signals representing brightness information and need not provide color information. Therefore, in this embodiment, the green color filter is adopted for the aperture pixels, as it offers greater brightness information compared to other color filters. This selection is based on the requirement for higher sensitivity in imaging in dark environments. The light shielded pixels in the crosstalk correction pixel units 130 may be arranged in the same RGB Bayer pattern as that of the effective imaging pixels for ease of production, or, only the green color filter may be used for the light shielded pixels.

FIG. 12D illustrates a variation example of the imaging device 300 of this embodiment in which the aperture pixels in the crosstalk correction pixel units 130 are white pixels. Using the white pixels instead of green pixels for the aperture pixels can further enhance the sensitivity to the light entering the aperture pixels. Since the pixels in the crosstalk correction pixel units 130 are not used for imaging, the use of white pixels does not affect the generation of the crosstalk correction pattern.

Optionally, the charge accumulation time for the crosstalk correction pixel units 130 may be made longer than that of the aperture pixel unit 120 for imaging to further enhance the accuracy of the output signals from the crosstalk correction pixel units 130 during the imaging by the imaging device 300 in dark environments. Prolonging the charge accumulation time for the crosstalk correction pixel units 130 can increase the intensity of the output signals from the aperture pixels and the light shielded pixels affected by light-induced crosstalk.

Figure 13:
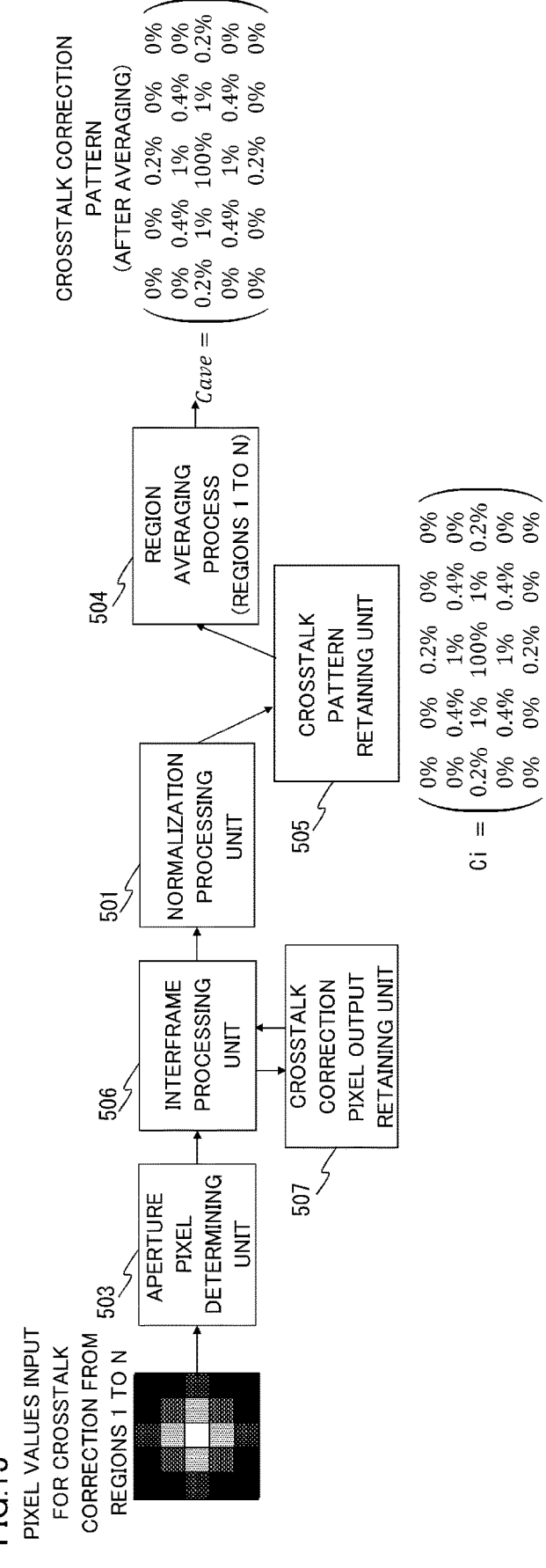
FIG. 13 is a block diagram of a correction pattern generation process in the imaging device according to the third embodiment.

FIG. 13 is a block diagram of a processor that executes the correction pattern generation process in the crosstalk correction pattern generator 500 of this embodiment. In this embodiment, an interframe processing unit 506 performs processing to the outputs from the aperture pixels retained in the crosstalk pattern retaining unit 505 in the crosstalk correction pattern generator 500. The output signals from the aperture pixels in the crosstalk correction pixel units 130 of regions 1 to N that fall within a suitable range may be at a low level. In such cases, applying a frame addition process to the output signals from the aperture pixels for each region can reduce the impact of noise.

In the crosstalk correction pattern generator 500 of this embodiment, first, the aperture pixel determining unit 503 determines whether or not the output signals from the aperture pixels of the crosstalk correction pixel units 130 in regions 1 to N are within a predetermined range. The interframe processing unit 506 adds up signal data of a preceding frame retained in the crosstalk correction pixel output retaining unit 507 to the signal data of the current frame. The data of the output signals from the aperture pixels that fall outside the specified range, as determined by the aperture pixel determining unit 503, is not included in the addition. The data after the addition process by the interframe processing unit 506 is retained in the crosstalk correction pixel output retaining unit 507, as well as output to the downstream normalization processing unit 501. The processing performed at the normalization processing unit 501, crosstalk pattern retaining unit 505, and region averaging unit 504 is the same as that of the second embodiment and will not be described again.

In this embodiment in which the imaging device 300 captures color images, green or white pixels with high sensitivity are used for the pixels dedicated to crosstalk correction, and a frame averaging process is performed in the crosstalk correction pattern generator 500. This feature is expected to improve the accuracy in generating the crosstalk correction patterns under low illuminance, which in turn will enhance the accuracy of crosstalk correction.

Fourth Embodiment

An imaging device according to a fourth embodiment is described with reference to FIG. 14. The following mainly describes the differences from the first to third embodiments. The configurations similar to those of the first to third embodiments are given the same reference numerals and will not be described in detail.

Figure 14:
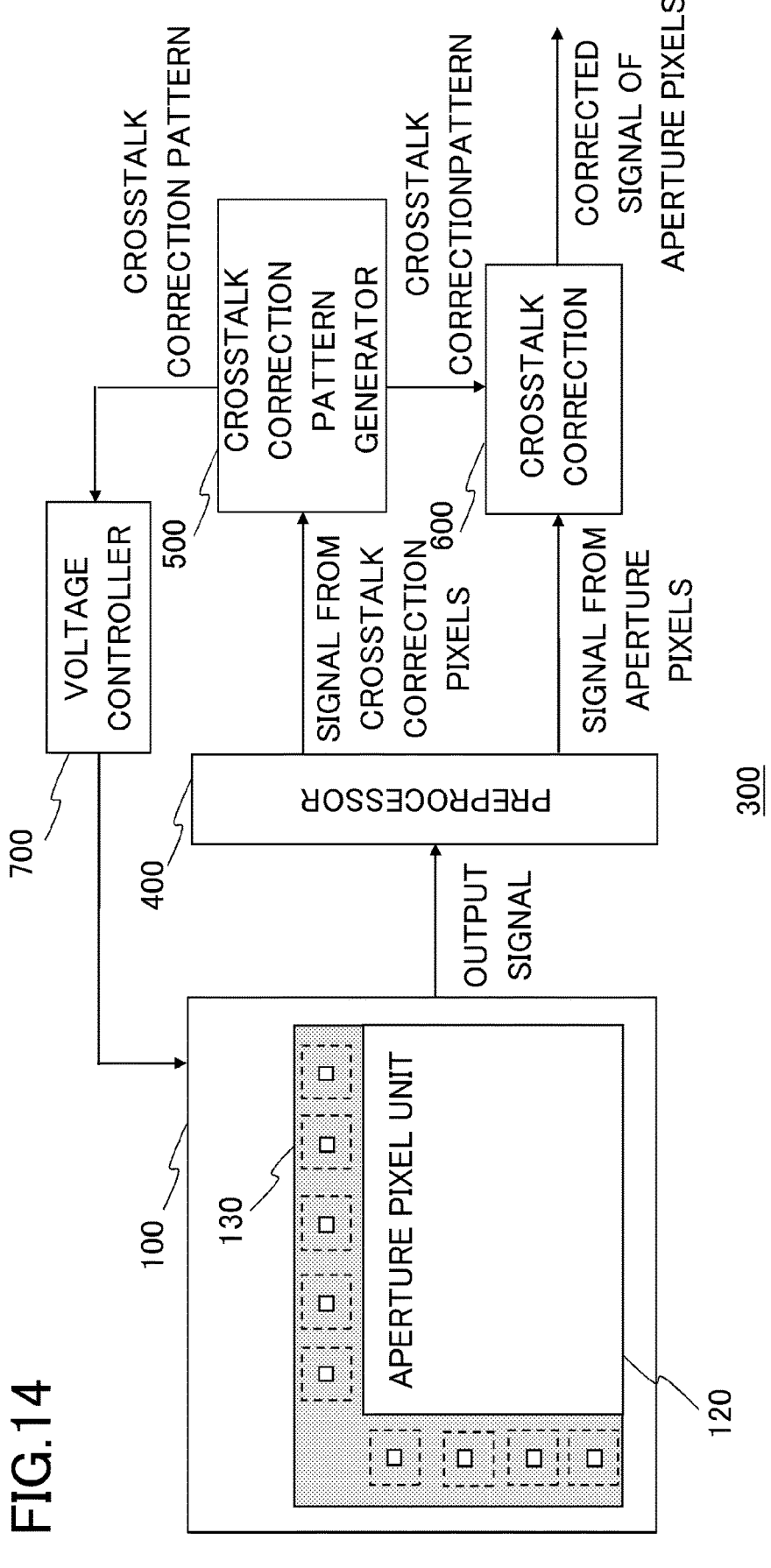
FIG. 14 is a block diagram of an imaging device according to a fourth embodiment.

FIG. 14 shows a block diagram of the entire imaging device 300 in this embodiment. The imaging device 300 is different from the imaging devices 300 of the first to third embodiments in that the device includes a voltage controller 700 that controls the voltage of the photoelectric device 100 based on an input of a crosstalk correction pattern.

The level of crosstalk caused by the light emission from avalanche breakdown in aperture pixels changes according to the voltage state of the photoelectric converter. In the imaging devices 300 according to the first to third embodiments, crosstalk correction is implemented using a crosstalk correction pattern. The level of crosstalk can vary depending on the temperature conditions or chronological changes, and there is a possibility that certain pixels may remain uncorrected if the level of crosstalk increases. The imaging device 300 of this embodiment generates a crosstalk correction pattern in real time, and the voltage controller 700 compares it with a predetermined crosstalk correction pattern and changes the voltage based on the comparison result. The imaging device 300 performs feedback control to maintain the level of correction applied to the output signals of the pixels using the crosstalk correction pattern within a certain range. While the imaging device 300 of this embodiment controls the voltage VL, it maybe the voltage VH that is controlled. The imaging device 300 may perform feedback control such as to minimize the values for the light shielded pixels in the crosstalk correction pattern.

According to this embodiment, the level of correction applied to the output signals of the pixels using the crosstalk correction pattern is maintained within a certain range, so that the accuracy of crosstalk correction can further be enhanced.

Fifth Embodiment

Figure 15:
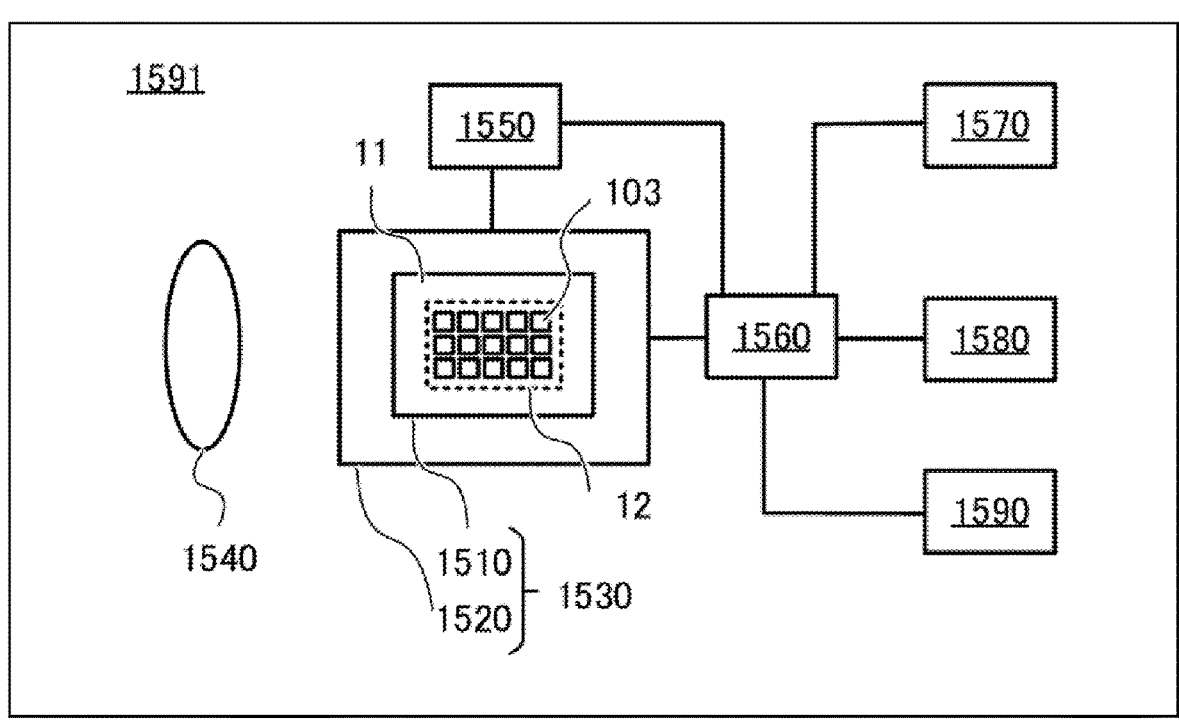
FIG. 15 is a diagrammatic view of an instrument that includes a semiconductor device according to a fifth embodiment.

Any of the first to fourth embodiments described above can be applied to a fifth embodiment. FIG. 15 is a schematic view for explaining equipment 1591 including a semiconductor apparatus 1530 of the present embodiment. The semiconductor apparatus 1530 can be any of the imaging devices described in the first to fourth embodiments, or an imaging device obtained by combining a plurality of the embodiments. The equipment 1591 including the semiconductor apparatus 1530 will be described in detail. As described above, the semiconductor apparatus 1530 can include a semiconductor device 1510 having a semiconductor layer, and a package 1520 which houses the semiconductor device 1510. The package 1520 can include a substrate to which the semiconductor device 1510 is fixed, and a lid made of glass or the like which faces the semiconductor device 1510. The package 1520 can further include a joining member such as a bonding wire or a bump which connects a terminal provided on the substrate and a terminal provided on the semiconductor device 1510.

The equipment 1591 can include at least any of an optical device 1540, a control device 1550, a processing device 1560, a display device 1570, a storage device 1580, and a mechanical device 1590. The optical device 1540 is compliant with the semiconductor apparatus 1530. The optical device 1540 is, e.g., a lens, a shutter, or a mirror. The control device 1550 controls the semiconductor apparatus 1530. The control device 1550 is a semiconductor apparatus such as, e.g., an ASIC.

The processing device 1560 processes a signal output from the semiconductor apparatus 1530. The processing device 1560 is a semiconductor apparatus such as a CPU or an ASIC for constituting an AFE (analog front end) or a DFE (digital front end). The display device 1570 is an EL display device or a liquid crystal display device which displays information (image) obtained by the semiconductor apparatus 1530. The storage device 1580 is a magnetic device or a semiconductor device which stores information (image) obtained by the semiconductor apparatus 1530. The storage device 1580 is a volatile memory such as an SRAM or a DRAM, or a non-volatile memory such as a flash memory or a hard disk drive.

The mechanical device 1590 has a moving unit or a propulsive unit such as a motor or an engine. In the equipment 1591, a signal output from the semiconductor apparatus 1530 is displayed in the display device 1570, and is transmitted to the outside by a communication device (not shown) provided in the equipment 1591. In order to do so, it is preferable that the equipment 1591 further includes the storage device 1580 and the processing device 1560 in addition to a storage circuit and an operation circuit of the semiconductor apparatus 1530. The mechanical device 1590 may also be controlled on the basis of a signal output from the semiconductor apparatus 1530.

In addition, the equipment 1591 is suitably used as electronic equipment such as an information terminal having photographing function (e.g., a smartphone or a wearable terminal) or a camera (e.g., an interchangeable-lens camera, a compact camera, a video camera, or a surveillance camera). The mechanical device 1590 in the camera can drive components of the optical device 1540 for zooming, focusing, and shutter operation. Alternatively, the mechanical device 1590 in the camera can move the semiconductor apparatus 1530 for vibration isolation operation.

The equipment 1591 can be transport equipment such as a vehicle, a ship, or a flight vehicle. The mechanical device 1590 in the transport equipment can be used as a moving device. The equipment 1591 serving as the transport equipment is suitably used as equipment which transports the semiconductor apparatus 1530, or performs assistance and/or automation of driving (manipulation) with photographing function. The processing device 1560 for assistance and/or automation of driving (manipulation) can perform processing for operating the mechanical device 1590 serving as the moving device based on information obtained in the semiconductor apparatus 1530. Alternatively, the equipment 1591 may also be medical equipment such as an endoscope, measurement equipment such as a distance measurement sensor, analysis equipment such as an electron microscope, office equipment such as a copier, or industrial equipment such as a robot.

According to the fifth embodiment, it becomes possible to obtain excellent pixel characteristics. Consequently, it is possible to enhance the value of the semiconductor apparatus 1530. At least any of addition of function, an improvement in performance, an improvement in characteristics, an improvement in reliability, an improvement in product yield, a reduction in environmental load, a reduction in cost, a reduction in size, and a reduction in weight corresponds to the enhancement of the value thereof mentioned herein.

Consequently, if the semiconductor apparatus 1530 according to the fifth embodiment is used in the equipment 1591, it is possible to improve the value of the equipment as well. For example, when the semiconductor apparatus 1530 is mounted on transport equipment and photographing of the outside of the transport equipment or measurement of an external environment is performed, it is possible to obtain excellent performance. Therefore, when the transport equipment is manufactured and sold, it is advantageous to determine that the semiconductor apparatus 1530 according to the fifth embodiment is mounted on the transport equipment in terms of increasing the performance of the transport equipment itself. The semiconductor apparatus 1530 is suitably used particularly as the transport equipment which performs driving assistance and/or automated driving of the transport equipment by using information obtained by the semiconductor apparatus 1530.

Sixth Embodiment

Figure 16:
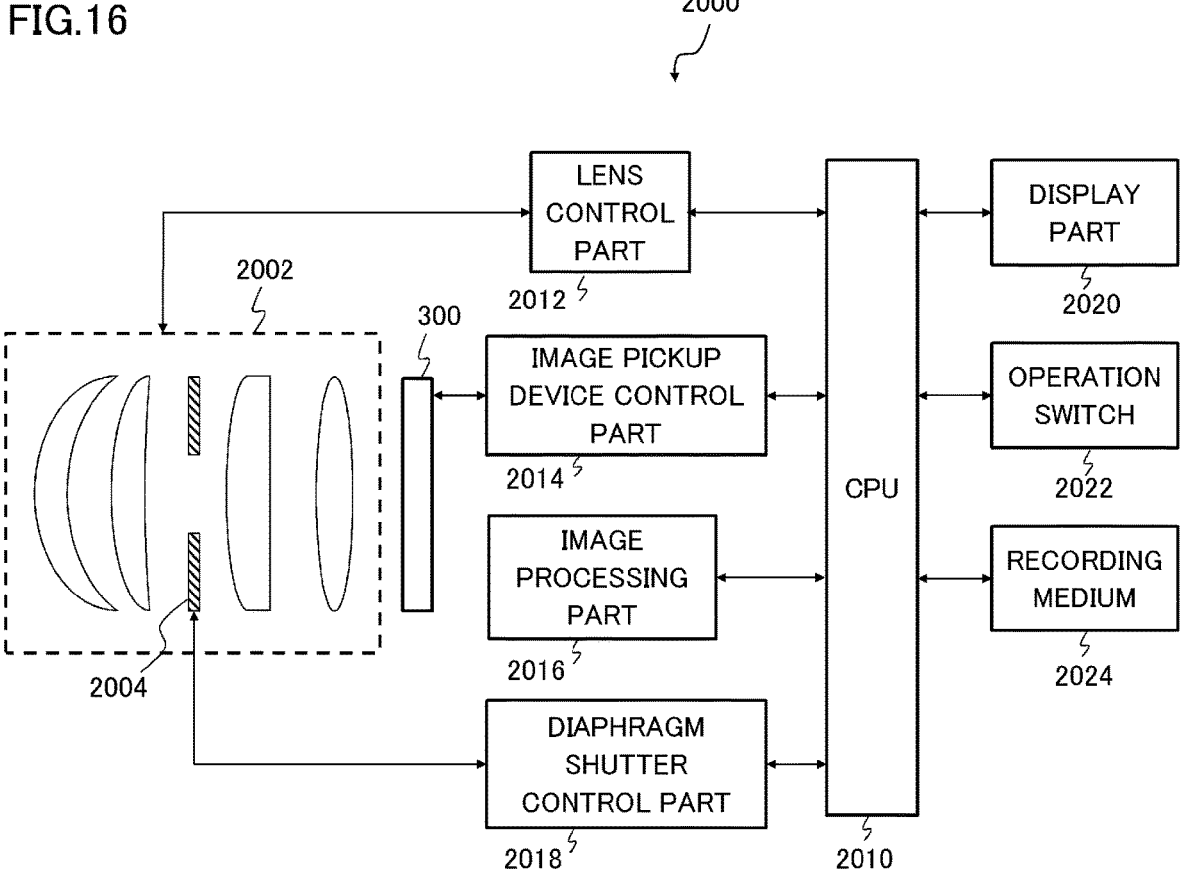
FIG. 16 is a diagram illustrating a configuration example of an imaging system according to a sixth embodiment.

An imaging system in accordance with the sixth embodiment of the present invention will be described by reference to FIG. 16. FIG. 16 is a block view showing a schematic configuration of an imaging system in accordance with the present embodiment.

The solid-state image pickup element (photoelectric conversion apparatus) described in the first to fourth embodiments is applicable to various imaging systems. The applicable imaging system has no particular restriction, and examples thereof may include various devices such as a digital still camera, a digital camcorder, a surveillance camera, a copier, a fax, a portable phone, an onboard camera, an observation satellite, and a medical camera. Further, a camera module including an optical system such as a lens and a solid-state image pickup element (photoelectric conversion apparatus) is also included in the imaging system. FIG. 16 shows a block view of a digital still camera as one example thereof.

An imaging system 2000 includes, as shown in FIG. 16, an image pickup apparatus 300, an image pickup optical system 2002, a CPU 2010, a lens control part 2012, an image pickup apparatus control part 2014, an image processing part 2016, and a diaphragm shutter control part 2018. The imaging system 2000 further includes a display part 2020, an operation switch 2022, and a recording medium 2024.

The image pickup optical system 2002 is an optical system for forming an optical image of an object, and includes a lens group, a diaphragm 2004, and the like. The diaphragm 2004 has a function of performing light amount adjustment by adjusting the aperture diameter, and additionally, also has a function as an exposure time adjusting shutter during photographing a still picture. The lens group and the diaphragm 2004 are held to be able to advance and retreat along the optical axis, and the linked operation thereof implements the scaling function (zooming function) and the focus adjusting function. The image pickup optical system 2002 may be integrated with the imaging system, or may be an image pickup lens mountable on the imaging system.

The image pickup apparatus 300 is disposed so that the image pickup surface is situated in the image space of the image pickup optical system 2002. The image pickup apparatus 300 is the solid-state image pickup element (photoelectric conversion apparatus) described in the first to fourth embodiments, and includes a CMOS sensor (pixel part) and the peripheral circuit (peripheral circuit region) thereof. For the image pickup apparatus 300, pixels having a plurality of photoelectric converting parts are disposed two dimensionally, and color filters are disposed with respect to the pixels, thereby forming a two dimensional single plate color sensor. The image pickup apparatus 300 photoelectrically converts the object image formed by the image pickup optical system 2002, and outputs it as an image signal or a focus detection signal.

The lens control part 2012 is for controlling the advancing/retreating driving of the lens group of the image pickup optical system 2002, and performing a scaling operation and focus adjustment, and includes a circuit and a processing device configured so as to implement the functions. The diaphragm shutter control part 2018 is for changing the aperture diameter of the diaphragm 2004 (with the diaphragm value as variable), and adjusting the photographing light amount, and includes a circuit and a processing device configured so as to implement the functions.

The CPU 2010 is a control device in a cameral for governing various controls of the camera main body, and includes an operation part, a ROM, a RAM, an A/D converter, a D/A converter, a communication interface circuit, and the like. The CPU 2010 controls the operation of each part in the camera according to the computer program stored in the ROM or the like, and executes a series of photographing operations such as AF, image pickup, image processing, and recording including the detection of the focus state (focus detection) of the image pickup optical system 2002. The CPU 2010 is also a signal processing part.

The image pickup apparatus control part 2014 is for controlling the operation of the image pickup apparatus 300, and A/D converting the signal outputted from the image pickup apparatus 300, and sending it to the CPU 2010, and includes a circuit and a control device configured so as to implement the functions. It does not matter if the A/D converting function is possessed by the image pickup apparatus 300. The image processing part 2016 is a processing device for performing image processing such as y conversion or color interpolation on the A/D-converted signal, and generating an image signal, and includes a circuit and a control device configured so as to implement the functions. The display part 2020 is a display device such as a liquid crystal display device (LCD), and displays the information on the photographing mode of a camera, a preview image before photographing, a confirming image after photographing, the focused state upon focus detection, and the like. The operation switch 2022 includes a power supply switch, a release (shooting trigger) switch, a zooming operation switch, a shooting mode selecting switch, and the like. The recording medium 2024 is for recording the photographed image or the like, and may be the one included in the imaging system, or may be the detachable one such as a memory card.

The imaging system 2000 to which the image pickup apparatus 300 in accordance with the first to fourth embodiments is applied is configured in this manner. As a result, a high performance imaging system can be implemented.

Seventh Embodiment

Figure 17A:
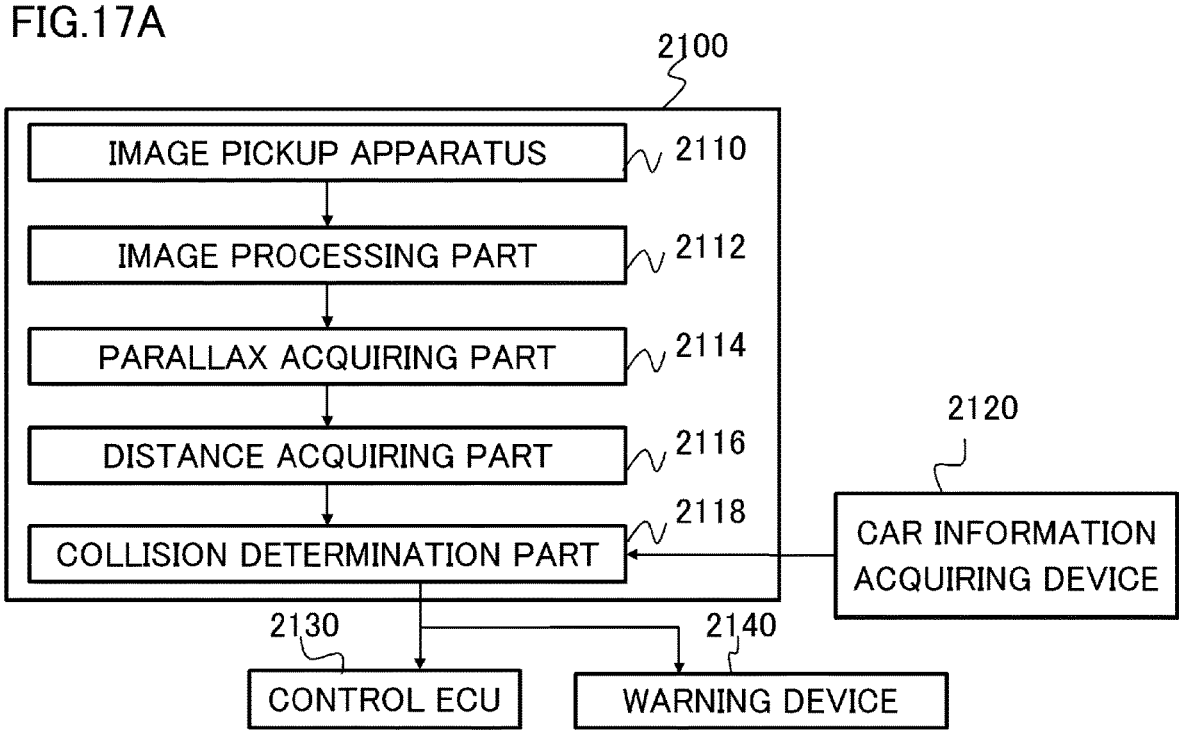
FIGS. 17A and 17B are diagrams illustrating a configuration example of an imaging system and a moving body according to a seventh embodiment.
Figure 17B:
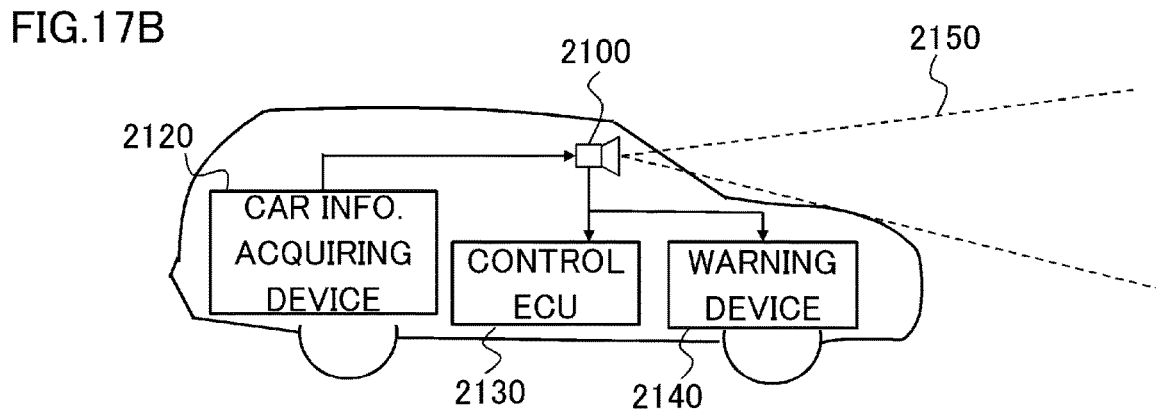

An imaging system and a mobile unit in accordance with the seventh embodiment of the present invention will be described by reference to FIGS. 17A and 17B. FIGS. 17A and 17B are views showing the configuration of the imaging system and the mobile unit in accordance with the present embodiment.

FIG. 17A shows one example of an imaging system 2100 regarding an onboard camera. The imaging system 2100 has an image pickup apparatus 2110. The image pickup apparatus 2110 is any of the image pickup apparatus as described in the first to fourth embodiments. The imaging system 2100 has an image processing part 2112 which is a processing device for performing image processing on a plurality of image data acquired by the image pickup apparatus 2110. In addition, the imaging system 2100 has a parallax acquiring part 2114 which is a processing device for performing calculation of the parallax (phase contrast between parallax images) from the plurality of image data acquired by the image pickup apparatus 2110. Further, the imaging system 2100 has a distance acquiring part 2116 which is a processing device for calculating the distance to the object based on the calculated parallax, and a collision determination part 2118 which is a processing device for determining whether there is a collision possibility or not based on the calculated distance. Herein, the parallax acquiring part 2114 or the distance acquiring part 2116 is one example of the information acquiring means for acquiring the information such as the distance information to the object. Namely, the distance information is the information regarding the parallax, the defocus amount, the distance to the object, or the like. The collision determination part 2118 may determine the collision possibility using any of the distance information. The processing devices may be implemented by an exclusively designed hardware, or may be implemented by a general-purpose hardware for performing operation based on a software module. Further, the processing device may be implemented by a FPGA (Field Programmable Gate Array), an ASIC (Application Specific Integrated Circuit), or the like, or may be implemented by the combination thereof.

The imaging system 2100 is connected to a car information acquiring device 2120, and can acquire car information such as the car speed, the yaw rate, or the steering angle. Further, to the imaging system 2100, a control ECU 2130 which is a control device for outputting a control signal for causing a car to generate a braking power based on the determination result of the collision determination part 2118. Namely, the control ECU 2130 is one example of the mobile unit control means for controlling the mobile unit based on the distance information. Further, the imaging system 2100 is also connected to a warning device 2140 for issuing a warning to a driver based on the determination results at the collision determination part 2118. For example, when the collision possibility is high as the determination result of the collision determination part 2118, the control ECU 2130 performs car control of applying brakes, releasing the accelerator, suppressing the engine output, or the like, thereby avoiding collision, and reducing the damage. The warning device 2140 sounds a warning such as a sound, displays warning information on a screen of a car navigation system, or the like, applies a vibration to a seat belt or a steering, and performs other operations, thereby giving a warning to a user.

In the present embodiment, the periphery, for example, the front or the rear of the car is imaged by the imaging system 2100. FIG. 17B shows the imaging system 2100 when the car front (imaging region 2150) is imaged. The car information acquiring device 2120 sends instructions so as to operate the imaging system 2100 to execute image pickup. By using the image pickup apparatus of the first to fourth embodiments as the image pickup apparatus 2110, the imaging system 2100 of the present embodiment can be more improved in precision of the distance measurement.

In the description up to this point, a description has been given to the example in which control is performed so as to prevent the collision with other cars. However, the present invention is applicable to the control of performing autonomous driving following another car, control of performing autonomous driving so as not to depart from the lane, and the like. Further, the imaging system is applicable to a mobile unit (transportation equipment) such as a ship, an aircraft, or an industrial robot not limited to a car such as an automobile. Mobile devices in the mobile unit (transportation equipment) are various driving sources such as an engine, a motor, a wheel, and a propeller. In addition, the present invention is applicable to, not limited to the mobile units, devices widely using object recognition such as the intelligent transport system (ITS).

The present disclosure enables an improvement in the correction accuracy of the output signals from defective pixels and the quality of the generated images in an imaging device.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-150477, filed on Sep. 21, 2022, which is hereby incorporated by reference herein in its entirety.

What is claimed is:

1. An imaging device comprising:

a photoelectric device in which a plurality of pixels containing a photoelectric element including an avalanche photodiode are arranged in a two-dimensional array; and a processor that processes output signals of the plurality of pixels, wherein the plurality of pixels includes a first pixel unit having imaging pixels, and a second pixel unit having at least one set of pixels including an aperture pixel and light shielded pixels that surround at least a part of the aperture pixel, the processor uses output signals of the aperture pixel and the light shielded pixels of the set of the pixels to generate a correction pattern for correcting output signals of the imaging pixels, the correction pattern corresponding to an output pattern of the set of the aperture pixel and the light shielded pixels, and an array of one-dimensional data included in the correction pattern, corresponding to at least one row or one column of the plurality of pixels, includes a peak value or a bottom value at a position corresponding to the aperture pixel.

2. The imaging device according to claim 1, wherein the array of one-dimensional data has a distribution in which values change monotonously from the peak value or the bottom value toward a data end.

3. The imaging device according to claim 1, wherein another array of one-dimensional data including the peak value or the bottom value of the said array of one-dimensional data and perpendicular to the said array of one-dimensional data has a distribution in which values change monotonously from the peak value or the bottom value toward a data end.

4. The imaging device according to claim 3, wherein the correction pattern configures two-dimensional data of N rows and M columns where one of N and M represents an integer of 2 or more and the other of N and M represents an integer of 1 or more.

5. The imaging device according to claim 1, wherein the processor uses a ratio between an output signal of the aperture pixel and output signals of the light shielded pixels to generate the correction pattern.

6. The imaging device according to claim 5, wherein the processor normalizes output signals of the light shielded pixels based on an output signal of the aperture pixel to generate the correction pattern.

7. The imaging device according to claim 1, wherein the processor corrects output signals of the imaging pixels using the correction pattern.

8. The imaging device according to claim 1, wherein the second pixel unit includes at least two sets of pixels, the at least two sets of pixels including a first pixel set having a first aperture pixel and a second pixel set having a second aperture pixel, the first aperture pixel and the second aperture pixel being distanced from each other by at least two pixels.

9. The imaging device according to claim 8, wherein the imaging pixels are arranged between the first aperture pixel and the second aperture pixel.

10. The imaging device according to claim 8, wherein the processor generates a correction pattern for correcting output signals of the imaging pixels using a correction pattern generated by use of an output signal of the first aperture pixel and output signals of light shielded pixels of a set of pixels including the first aperture pixel, and a correction pattern generated by use of an output signal of the second aperture pixel and output signals of light shielded pixels of a set of pixels including the second aperture pixel.

11. The imaging device according to claim 1, wherein the first pixel unit is composed of two or more pixels having different spectral sensitivities, and the aperture pixel of the second pixel unit is composed of a pixel having one spectral sensitivity.

12. The imaging device according to claim 11, wherein the first pixel unit is composed of a red pixel, a green pixel, and a blue pixel, and the aperture pixel of the second pixel unit is a white pixel.

13. The imaging device according to claim 1, wherein the imaging pixels in the first pixel unit have a charge accumulation time that is different from a charge accumulation time for the aperture pixel and the light shielded pixels in the second pixel unit.

14. The imaging device according to claim 1, wherein the processor performs a frame addition process to output signals of the aperture pixel and the light shielded pixels of the set of pixels in the second pixel unit.

15. An imaging system comprising:

the imaging device according to claim 1; and a signal processor that processes signals output from the imaging device.

16. A moving body comprising:

the imaging device according to claim 1;

a moving device;

a signal processor that acquires information from signals output from the imaging device; and a controller that controls the moving device based on the information.

17. An instrument comprising:

the imaging device according to claim 1, wherein the instrument further comprises at least any one of:

an optical device operable with the imaging device;

a controller that controls the imaging device;

a signal processor that processes signals output from the imaging device;

a display device that displays information acquired by the imaging device;

a memory device that stores information acquired by the imaging device; and a machine that operates based on information acquired by the imaging device.

18. An imaging device comprising:

a photoelectric device in which a plurality of pixels containing a photoelectric element including an avalanche photodiode are arranged in a two-dimensional array; and a processor that processes output signals of the plurality of pixels, wherein the plurality of pixels includes a first pixel unit having imaging pixels, and a second pixel unit having at least one set of pixels including an aperture pixel and light shielded pixels that surround at least a part of the aperture pixel, the processor uses output signals of the aperture pixel and the light shielded pixels of the set of the pixels to generate a correction pattern for correcting output signals of the imaging pixels, the correction pattern corresponding to an output pattern of the set of the aperture pixel and the light shielded pixels, the first pixel unit is composed of two or more pixels having different spectral sensitivities, the aperture pixel of the second pixel unit is composed of a pixel having one spectral sensitivity, the first pixel unit is composed of a red pixel, a green pixel, and a blue pixel, and the aperture pixel of the second pixel unit is a green pixel.

19. An imaging device comprising:

a photoelectric device in which a plurality of pixels containing a photoelectric element including an avalanche photodiode are arranged in a two-dimensional array; and a processor that processes output signals of the plurality of pixels, wherein the plurality of pixels includes a first pixel unit having imaging pixels, and a second pixel unit having at least one set of pixels including an aperture pixel and light shielded pixels that surround at least a part of the aperture pixel, the processor uses output signals of the aperture pixel and the light shielded pixels of the set of the pixels to generate a correction pattern for correcting output signals of the imaging pixels, the correction pattern corresponding to an output pattern of the set of the aperture pixel and the light shielded pixels, and the processor controls voltage of the photoelectric device driving the photoelectric elements in accordance with the correction pattern.

* * * * *